(12) United States Patent
Chung

(10) Patent No.: US 11,073,536 B2
(45) Date of Patent: Jul. 27, 2021

(54) ID CHIP SOCKET FOR TEST CONNECTOR ASSEMBLY, TEST CONNECTOR ASSEMBLY INCLUDING ID CHIP SOCKET, AND TEST EQUIPMENT SET INCLUDING TEST CONNECTOR ASSEMBLY

(71) Applicant: ISC CO., LTD, Seongnam-si (KR)

(72) Inventor: Young Bae Chung, Seongnam-si (KR)

(73) Assignee: ISC CO., LTD., Seongnam-si (KR)

( * ) Notice: Subject to any disclaimer, the term of this patent is extended or adjusted under 35 U.S.C. 154(b) by 111 days.

(21) Appl. No.: 16/654,437

(22) Filed: Oct. 16, 2019

(65) Prior Publication Data

US 2020/0150148 A1     May 14, 2020

(30) Foreign Application Priority Data

Nov. 9, 2018   (KR) ........................ 10-2018-0137406

(51) Int. Cl.
*G01R 1/04*     (2006.01)
*H05K 7/10*     (2006.01)
(Continued)

(52) U.S. Cl.
CPC ....... *G01R 1/0408* (2013.01); *G01R 31/2851* (2013.01); *G06F 11/2733* (2013.01);
(Continued)

(58) Field of Classification Search
CPC ............... G06F 16/955; G06F 2201/80; G06F 11/1435; G06F 11/3058; G06F 16/122; G06F 17/18; G06F 21/602; G06F 11/3452; G06F 11/3466; G06F 11/3692; G06F 21/54; G06F 11/2733; G01R 31/2834; G01R 31/2856; G01R 31/2868; G01R 1/0408; G01R 1/0433; G01R 1/0458; G01R 31/2642; G01R 31/2849; G01R 31/2863; G01R 31/2886; G01R 31/54; G01R 1/0441; G01R 31/2851; G05D 1/0274; G06K 19/07; G06K 19/0723; G06K 2009/00738;
(Continued)

(56) References Cited

U.S. PATENT DOCUMENTS 5,390,129 A * 2/1995 Rhodes ............ G01R 31/31719
324/750.05
6,268,740 B1 * 7/2001 Iida .................... G01R 31/2834
324/750.19
(Continued)

FOREIGN PATENT DOCUMENTS

JP         5266723 B2    8/2013
KR     100928228 B1    11/2009
(Continued)

*Primary Examiner* — Vinh P Nguyen
(74) *Attorney, Agent, or Firm* — BakerHostetler

(57) ABSTRACT

An ID chip socket according to an embodiment disclosed herein includes: a contactor configured to be fixed to an upper side of the frame; a socket-conductive part penetrating the contactor in a vertical direction and configured to enable electrical connection in the vertical direction; an ID chip fixed to an upper side of the socket-conductive part and electrically connected to the socket-conductive part; and a cover configured to cover an upper surface of the ID chip and to be fixed to at least one of the contactor and the frame.

20 Claims, 17 Drawing Sheets

(51) Int. Cl.
*G06F 11/273* (2006.01)
*G01R 31/28* (2006.01)
*H01R 13/22* (2006.01)
*H01R 33/76* (2006.01)
*H01R 12/71* (2011.01)

(52) U.S. Cl.
CPC ........... *H01R 12/714* (2013.01); *H01R 13/22* (2013.01); *H01R 33/76* (2013.01); *H05K 7/1023* (2013.01)

(58) Field of Classification Search
CPC ............. G06K 2209/27; G06K 7/0017; G06K 9/00744; G06K 9/6268; G11C 2029/4402; G11C 29/12; H05K 7/1023; H01R 13/22; H01R 12/716; H01R 33/76; H01R 12/714
USPC .................................................... 324/756.01
See application file for complete search history.

(56) References Cited

U.S. PATENT DOCUMENTS

| | | | |
|---|---|---|---|
| 7,992,313 B2* | 8/2011 | Kitaura | G01R 33/04 33/355 R |
| 8,922,233 B2* | 12/2014 | Seo | G01R 31/2894 324/756.02 |
| 9,600,757 B2* | 3/2017 | Komatsu | G06K 19/07739 |
| 10,718,809 B1* | 7/2020 | Kim | G01R 1/0408 |
| 2009/0115611 A1 | 5/2009 | Kobayashi et al. | |

FOREIGN PATENT DOCUMENTS

| KR | 1020100023257 A | 3/2010 |
|---|---|---|
| KR | 101030804 B1 | 4/2011 |
| KR | 101879806 B1 | 7/2018 |

\* cited by examiner

US 11,073,536 B2

ID CHIP SOCKET FOR TEST CONNECTOR ASSEMBLY, TEST CONNECTOR ASSEMBLY INCLUDING ID CHIP SOCKET, AND TEST EQUIPMENT SET INCLUDING TEST CONNECTOR ASSEMBLY

CROSS-REFERENCE TO RELATED APPLICATION

This application is based upon and claims the benefit of priority from Korean Patent Application No. 10-2018-0137406, filed on Nov. 9, 2018, the entire contents of which are incorporated herein by reference.

TECHNICAL FIELD

The present disclosure relates to a test connector assembly disposed between a device to be inspected and test equipment, an ID (identification) chip socket disposed in the test connector assembly, and a test equipment set.

BACKGROUND

In an inspection process for determining whether a device to be inspected, such as a manufactured semiconductor device, is defective, a test connector assembly is disposed between the device to be inspected and a test equipment. There is known an inspection method for determining whether or not a device to be inspected is defective on the basis of applying an electric current between the device to be inspected and test equipment after electrically connecting the device to be inspected and the test equipment.

If the terminals of the device to be inspected come into direct contact with the terminals of the test equipment without using the test connector assembly, the terminals of the test equipment may be worn or damaged during repeated inspection, whereby a need to replace the entire test equipment may occur. Conventionally, the test connector assembly is used to prevent the need to replace the entire test equipment. Specifically, when the test connector assembly is worn or damaged due to repeated contact with the terminals of the devices to be inspected, only the corresponding test connector assembly may be replaced.

The selective use of the test connector assembly is important for efficient use of expensive test equipment, and it is important to recognize the time to replace the test connector assembly by managing the lifetime of the test connector assembly in order to accurately determine whether or not a device to be inspected is defective. In addition, in order for the test connector assembly to function, the test connector assembly must be positioned in a predetermined posture in the test equipment.

SUMMARY

Various embodiments of the present disclosure provide an identification chip socket that assists in obtaining accurate data by managing histories concerning the life management of a test connector assembly, inventory identification, identification of information and/or positions related to devices to be inspected, and the like.

Various embodiments of the present disclosure provide a means to reduce the risk of damage to an ID chip socket.

An aspect of the present disclosure provides embodiments of an ID chip socket as a component of a test connector assembly, in which the ID chip socket is fixed to a frame that supports a connector for testing. The ID chip socket according to a representative embodiment comprises: a contactor configured to be fixed to an upper side of the frame; a socket-conductive part penetrating the contactor in a vertical direction and configured to enable electrical connection in the vertical direction; an ID chip fixed to an upper side of the socket-conductive part and electrically connected to the socket-conductive part; and a cover configured to cover an upper surface of the ID chip and to be fixed to at least one of the contactor and the frame.

In other embodiments, the upper surface of the ID chip and an inner downwardly-facing surface of the cover may be disposed to form a vertical gap between the upper surface of the ID chip and the inner downwardly-facing surface of the cover.

In another embodiment, the vertical gap may be filled with air or a material that is more flexible than the material of the cover.

In one embodiment, a lateral surface of the ID chip and an inner lateral surface of the cover are disposed to form a lateral gap between the lateral surface of the ID chip and the inner lateral surface of the cover.

In a different embodiment, the cover may comprise: an upper portion that covers the upper surface of the ID chip; a lateral portion that covers a lateral surface of the ID chip; and an attachment portion fixed to at least one of the contactor and the frame below the lateral portion.

In another embodiment, the cover may be formed by coating the ID chip with a silicon material.

In other embodiments, the contactor may comprise a base plate made of an insulating material, and the socket-conductive part may comprise: a penetration portion made of a conductive material and vertically penetrating the base plate; at least one upper conductive plate disposed between an upper end of the penetration portion and the ID chip to enable electrical connection, the at least one upper conductive plate being fixed to an upper surface of the base plate; and a lower conductive plate disposed at a lower end of the penetration portion to enable electrical connection, the lower conductive plate being fixed to a lower surface of the base plate.

In one embodiment, the at least one upper conductive plate may comprise two upper conductive plates which are in contact with one of the penetration portion and are spaced apart from each other.

In another embodiment, the socket-conductive part may comprise a contact pad fixed to a lower side of the contactor and configured to be brought into contact with a test equipment. The contact pad may comprise: a sheet made of an elastically deformable insulating material; and a pad-conductive part extending in the sheet in the vertical direction to enable electrical connection in the vertical direction.

In a different embodiment, the ID chip may store at least one of identification information and history information. The identification information is identification information on the test connector assembly, and the history information is history information related to a lifespan or usage frequency of the test connector assembly.

Another aspect of the present disclosure provides embodiments of a test connector assembly disposed between a device to be inspected and test equipment to electrically connect the device to be inspected and the test equipment to each other. The test connector assembly according to a representative embodiment comprises: a frame supporting a connector for testing; and an ID chip socket fixed to an upper side of the frame. The ID chip socket comprises: a contactor fixed to the upper side of the frame; a socket-conductive part penetrating the contactor in a vertical direction and configured to enable electrical connection in the vertical direction; an ID chip fixed to an upper side of the socket-conductive part and electrically connected to the socket-conductive part; and a cover configured to cover an upper surface of the ID chip and fixed to at least one of the contactor and the frame.

In other embodiments, the cover may be fixed to the frame.

In one embodiment, the frame may comprise a plurality of layers including at least one first layer and at least one second layer below the at least one first layer, which are stacked in the vertical direction. A portion of the first layer may be opened such that the cover is fixed to an upper surface of the second layer.

In another embodiment, the frame may comprise a plurality of layers including at least one first layer and at least one second layer below the at least one first layer, which are stacked in the vertical direction. A portion of the first layer may be opened such that the contactor is fixed to an upper surface of the second layer.

In one embodiment, the frame may comprise a plurality of layers including at least one first layer and at least one second layer below the at least one first layer, which are stacked in the vertical direction. A portion of the first layer may be opened such that a portion of an upper surface of the second layer is exposed. Each of the contactor and the cover may be fixed to the portion of the upper surface of the second layer.

In a different embodiment, a hole is formed in a central portion of the portion of the upper surface of the second layer such that a lower end of the socket-conductive part is exposed downward.

Another aspect of the present disclosure provides embodiments of a test equipment set. The test equipment set according to a representative embodiment comprises: a test equipment; and a test connector assembly disposed between a device to be inspected and the test equipment to electrically connect the device to be inspected and the test equipment to each other. The test connector assembly comprises: a frame supporting a connector for testing; and an ID chip socket fixed to an upper side of the frame. The ID chip socket comprises: a contactor fixed to the upper side of the frame; a socket-conductive part penetrating the contactor in a vertical direction and configured to enable electrical connection in the vertical direction, the socket-conductive part having a lower end brought into contact with the test equipment; an ID chip fixed to an upper side of the socket-conductive part and electrically connected to the socket-conductive part; and a cover configured to cover an upper surface of the ID chip and fixed to at least one of the contactor and the frame. The ID chip is configured to execute at least one of an identification function of identifying at least one of the device to be inspected and the test connector assembly and a history management function of tracking a history of the ID chip socket by receiving an electrical signal from the test equipment or sending an electrical signal to the test equipment.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A and 6B are perspective views illustrating components of the ID chip socket 100, in which FIG. 6A is a perspective view illustrating an assembly of a contactor 110 and a socket conductive part 120, and FIG. 6B is a perspective view illustrating an assembly in which an ID chip 130 is added to the assembly of FIG. 6A;

FIGS. 8A and 8B are perspective views illustrating components of the ID chip socket 100, in which FIG. 8A is a perspective view illustrating an assembly of the contactor 110 and a socket conductive part 120 according to another embodiment, and FIG. 8B is a perspective view illustrating an assembly in which an ID chip 130 is added to the assembly of FIG. 8A;

DETAILED DESCRIPTION

Figure 1:
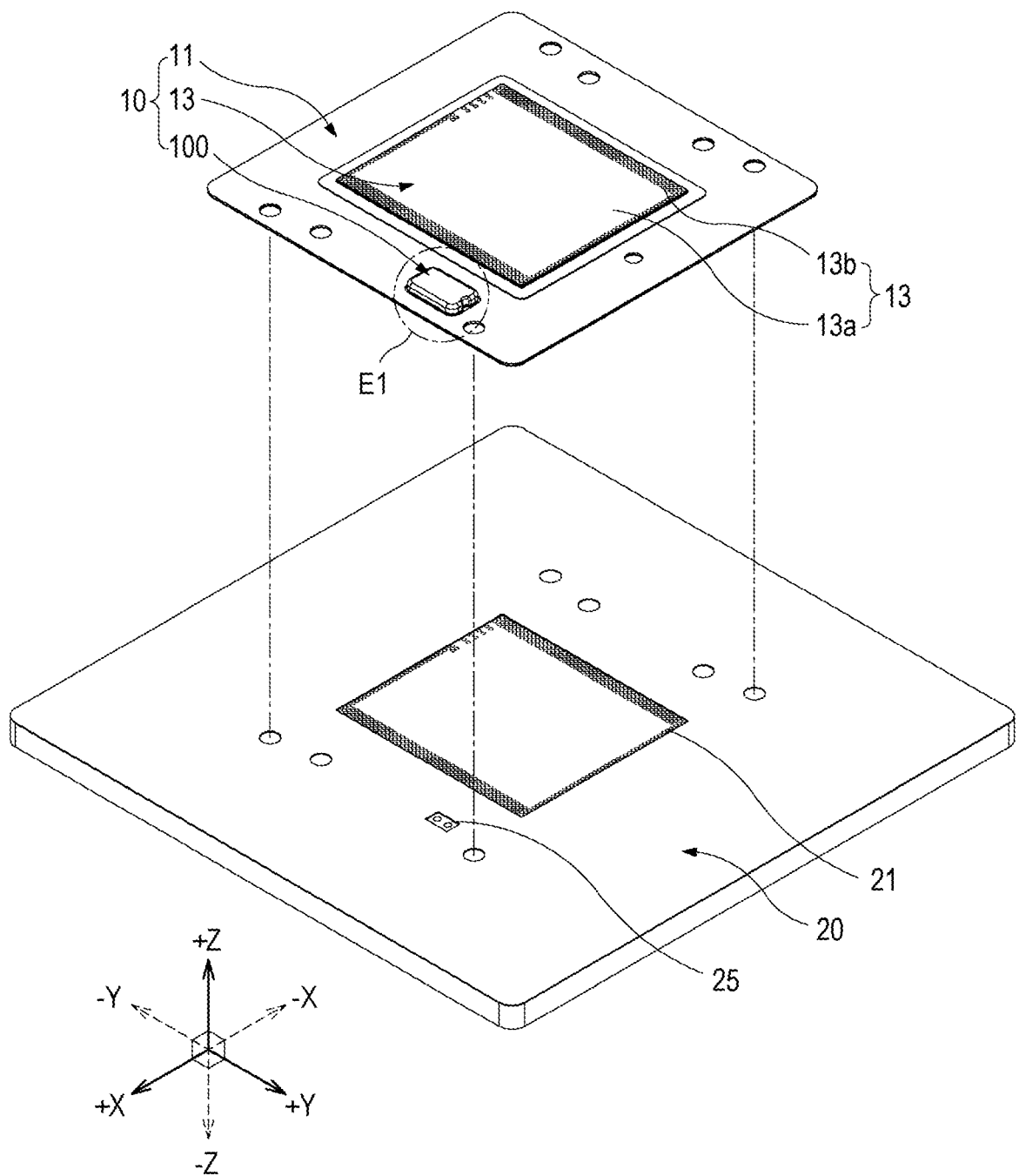
FIG. 1 is a perspective view of a test connector assembly 10 and test equipment 20 according to an embodiment of the present disclosure.

Embodiments of the present disclosure are illustrated for the purpose of explaining the technical idea of the present disclosure. The scope of the rights according to the present disclosure is not limited to the embodiments presented below or the detailed descriptions of such embodiments.

All the technical terms and scientific terms in the present disclosure include meanings or definitions that are commonly understood by those of ordinary skill in the art unless otherwise defined. All terms in the present disclosure are selected for the purpose of describing the present disclosure more clearly, and are not selected to limit the scope of the present disclosure.

As used in the present disclosure, expressions such as "comprising", "including", "having", and the like are to be understood as open-ended terms having the possibility of encompassing other embodiments, unless otherwise mentioned in the phrase or sentence containing such expressions.

The singular expressions that are described in the present disclosure may encompass plural expressions unless otherwise stated, which will be also applied to the singular expressions recited in the claims.

The expressions, such as "first," "second," etc., which are shown in various embodiments of the present disclosure, are used to separate a plurality of elements from each other, and are not intended to limit an order or importance of the corresponding elements.

In order to describe the present disclosure with reference to the drawings, description will be made on the basis of a spatial orthogonal coordinate system based on an X-axis, a Y-axis, and a Z-axis orthogonal to each other. That is, each configuration of the embodiments may be described on XYZ orthogonal coordinates. Each axial direction (the X-axis direction, Y-axis direction, or Z axis direction) means opposite directions in which each axis extends. The plus (+) sign in front of each axis (+X-axis direction, +Y-axis direction, or +Z axis direction) means the positive direction, which is one of the opposite directions in which each axis extends. The minus (−) sign in front of each axis (−X-axis direction, −Y-axis direction, or −Z axis direction) means the negative direction, which is the remaining one of the opposite directions in which each axis extends. This is merely a reference set for describing the present disclosure, so that the present disclosure can be clearly understood, and it is needless to say that the directions may be defined differently depending on where the reference is placed.

The term "XZ plane" means a plane parallel to the X axis and the Z axis, the term "YZ plane" means a plane parallel to the Y axis and the Z axis, and the term "XY plane" means a plane parallel to the X axis and the Y axis.

Directional terms such as "upward" and "up" used in this disclosure mean the +Z-axis direction, directional terms such as "downward", "down" and "below" mean the −Z-axis direction, and directional terms such as "vertical direction" means the Z-axis direction. In addition, the direction directives such as "lateral" means a direction perpendicular to the Z-axis direction, and may include the X-axis direction and the Y-axis direction. This is merely a reference set for describing the present disclosure, so that the present disclosure can be clearly understood, and it is needless to say that the upward, downward, and lateral directions may be defined differently depending on where the reference is placed.

Hereinafter, embodiments of the present disclosure will be described with reference to the accompanying drawings. In the accompanying drawings, the same or corresponding components are denoted by the same reference numerals. In the following description of the embodiments, duplicate descriptions of the same or corresponding components may be omitted. However, even if the descriptions of components are omitted, it is not intended that such components are not included in any embodiment.

A device to be inspected (not illustrated) may be a semiconductor device or the like. The device to be inspected includes a plurality of terminals (not illustrated). The plurality of terminals are disposed on the lower surface of the device to be inspected.

Figure 2:
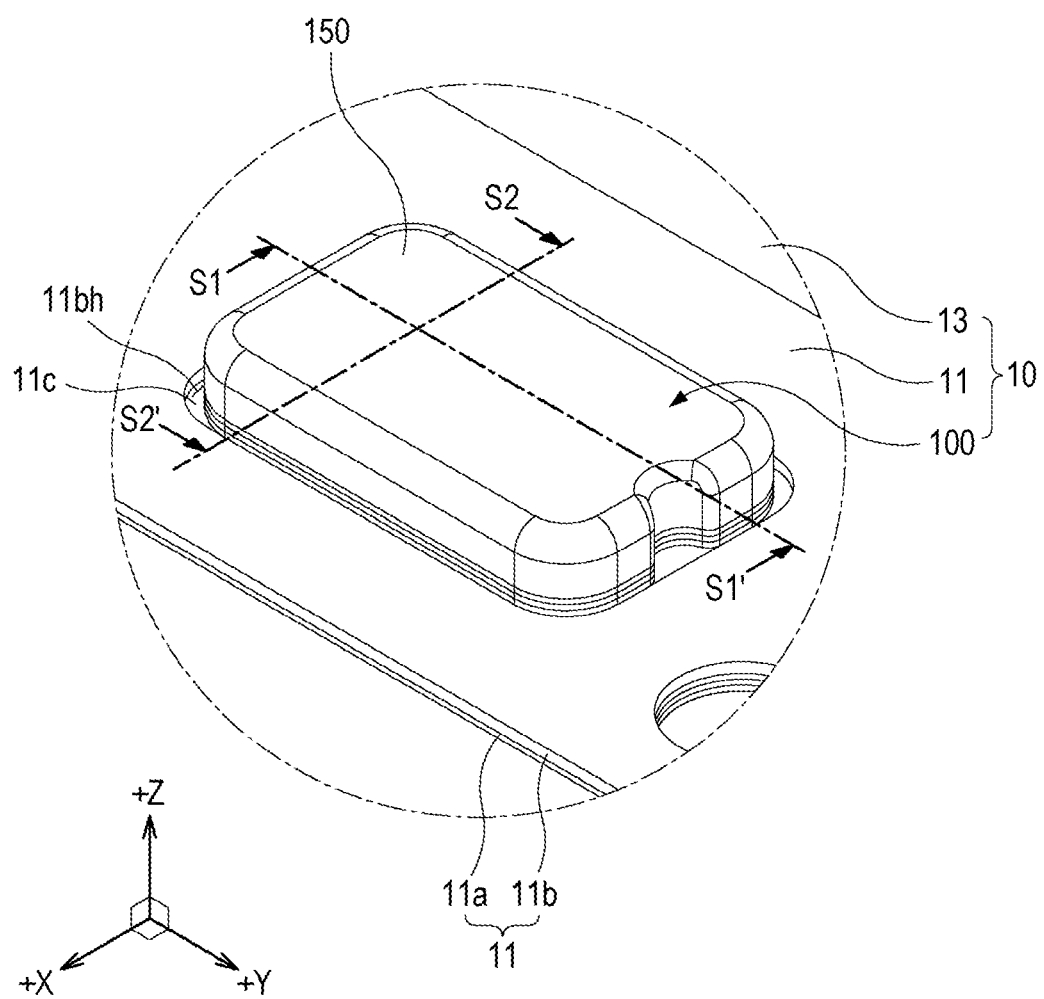
FIG. 2 is an enlarged perspective view of a portion E1 in FIG. 1.
Figure 3:
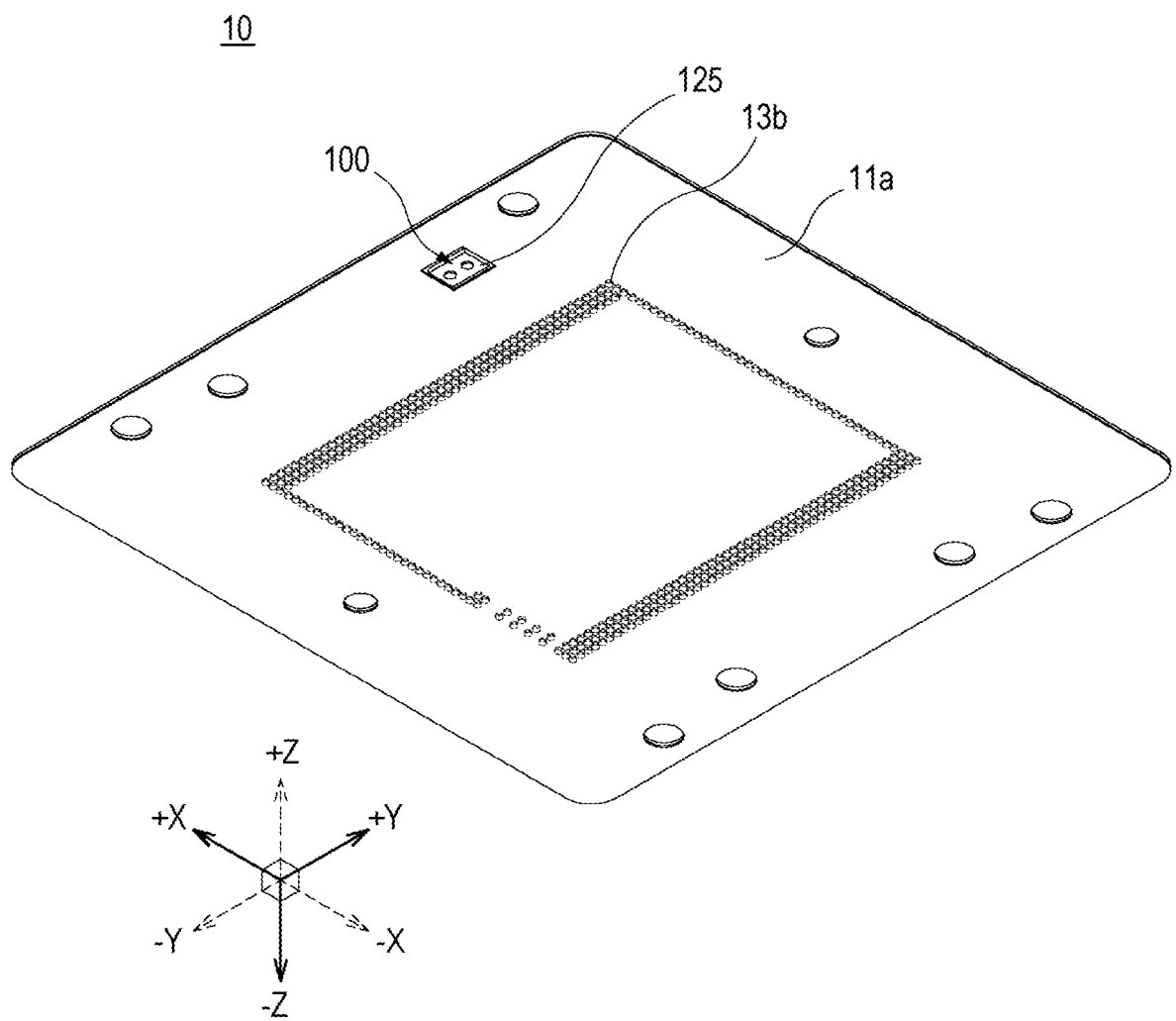
FIG. 3 is a perspective view of the test connector assembly 10 of FIG. 1 viewed from a different direction.

FIG. 1 is a perspective view of a test connector assembly 10 and test equipment 20 according to an embodiment of the present disclosure. FIG. 2 is an enlarged perspective view of a portion E1 in FIG. 1. FIG. 3 is a perspective view of the test connector assembly 10 of FIG. 1 viewed from a different direction.

Referring to FIGS. 1 to 3, a test equipment set includes test equipment 20 and a test connector assembly 10. The test equipment 20 includes a plurality of terminals 21. The plurality of terminals 21 correspond to the plurality of terminals of the device to be inspected. The plurality of terminals 21 are disposed on the upper surface of the test equipment 20. When inspecting the device to be inspected, the plurality of terminals 21 may be in contact with the lower surface of a connector 13 of the test connector assembly 10.

The test equipment 20 includes a connection counterpart 25 that is in contact with the lower surface of an ID chip socket 100. The connection counterpart 25 is in contact with the contact pads 125 of the ID chip socket 100. The connection counterpart 25 is a portion electrically connected to the ID chip socket 100.

The test connector assembly 10 may be disposed between the device to be inspected and the test equipment 20 to electrically connect the device to be inspected and the test equipment 20 to each other. The test connector assembly 10 includes a connector 13 configured to electrically connect the device to be inspected and the test equipment 20 to each other, and a frame 11 supporting the connector 13 for testing.

The connector 13 includes a connector-insulating portion 13a and a connector-conductive portion 13b. When inspecting the device to be inspected, the plurality of terminals of the device to be inspected are brought into contact with the upper end of the connector-conductive portion 13b, and the plurality of terminals 21 of the test equipment 20 are brought into contact with the lower end of the connector-conductive portion 13b.

The test connector assembly 10 includes an Identification (ID) chip Socket 100. The ID chip socket 100 is fixed to the frame 11. The ID chip socket 100 is fixed to the upper side of the frame 11. The ID chip socket 100 may be disposed to be laterally spaced apart from the connector 13.

The ID chip socket 100 is capable of performing information management functions such as life management of the ID chip socket 100, inventory identification, and identification of information and/or positions related to devices to be inspected. In addition, the ID chip socket 100 is capable of performing various known functions.

The ID chip 130 of the ID chip socket 100 may receive an electrical signal from the test equipment 20 or may send an electrical signal to the test equipment 20. Specifically, the ID chip 130 may be configured to be capable of receiving an electrical signal from the test equipment 20 but not to be capable of sending an electrical signal to the test equipment 20, may be configured to be capable of sending an electrical signal to the test equipment 20 but not to be capable of receiving an electrical signal from the test equipment 20, or may be configured to be capable of sending and receiving an electrical signal to and from the test equipment 20.

The test equipment set may perform at least one of an identification function and a history management function by the ID chip's receiving an electrical signal from the test equipment 20 or the ID chip's sending an electrical signal to the test equipment 20. At least one of the test equipment 20 and the ID chip socket 100 may perform at least one of an identification function and a history management function. For example, the ID chip 130 of the ID chip socket 100 may be configured to perform at least one of an identification function and a history-tracking function. For example, the test equipment 20 may be configured to perform at least one of an identification function and a history-tracking function.

The identification function may be a function of identifying at least one of the device to be inspected and the test connector assembly 10. For example, the identification function may include a function to receive information on a device to be inspected from the test equipment 20 to identify the device. In another example, the identification function may include a function of identifying whether the test connector assembly 10 in which the ID chip socket 100 is disposed is correctly positioned in the test equipment 20.

The history-tracking function may be a function of tracking the history of the ID chip socket 100. For example, the history-tracking function may include a function of identifying information such as the lifespan or usage frequency of the test connector assembly 10 in which the ID chip socket 100 is disposed. In another example, the history-tracking function may include a function of identifying the inventory of corresponding test connector assemblies 10.

The ID-chip socket 100 is capable of obtaining accurate data related to the above-described information. The ID chip 130 provided in the ID chip socket 100 may be an electronic device capable of performing the functions described above.

In an embodiment, the ID chip 130 may store at least one of identification information of the test connector assembly 10 to which the ID chip 130 belongs and history information related to the lifespan or usage frequency of the test connector assembly 10. The test equipment 20 may receive at least one of the identification information and the history information from the ID chip 130 through an electrical signal.

Figure 4:
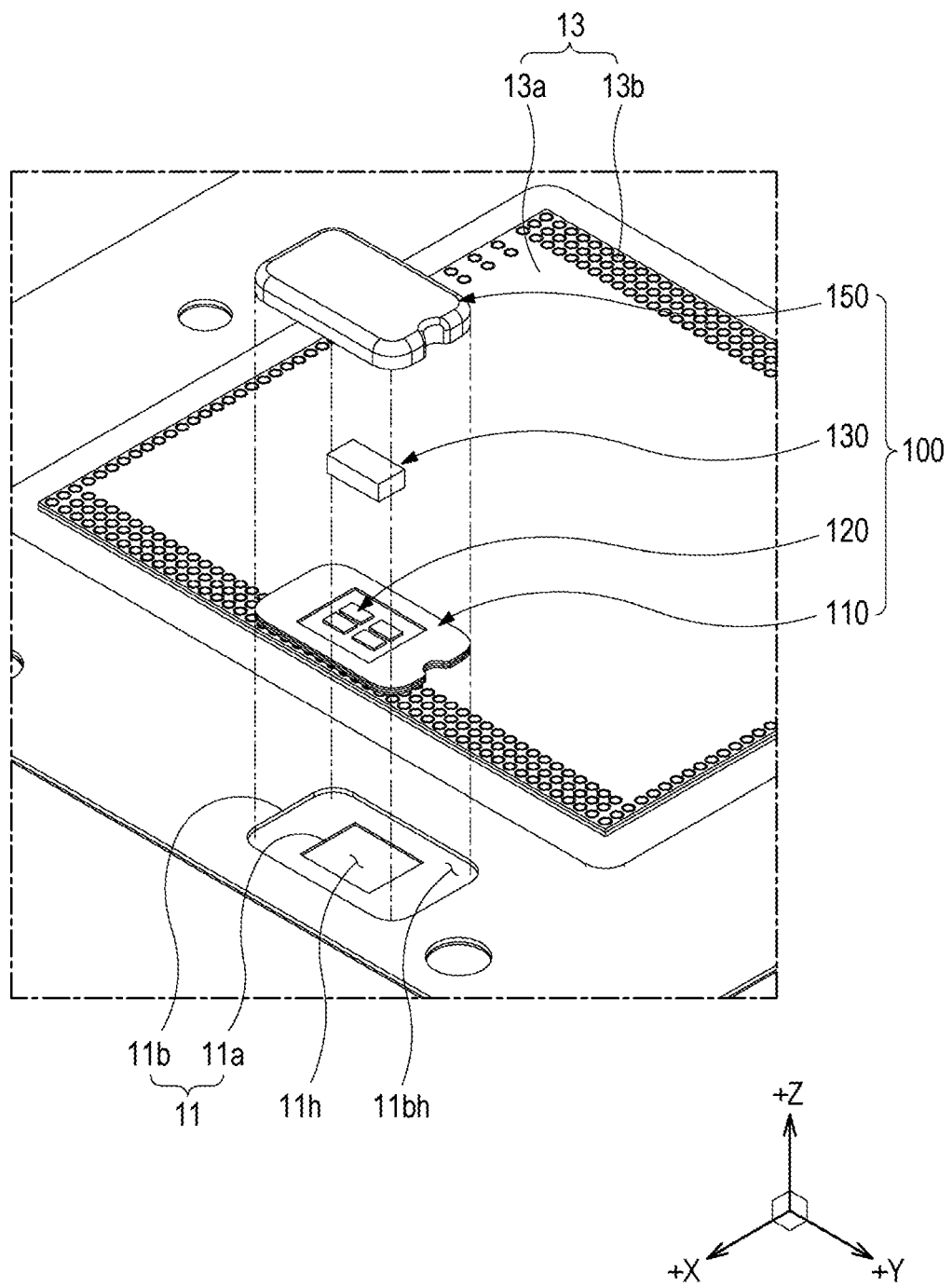
FIG. 4 is an exploded perspective view of the ID chip socket 100 of the test connector assembly 10 of FIG. 1.
Figure 5:
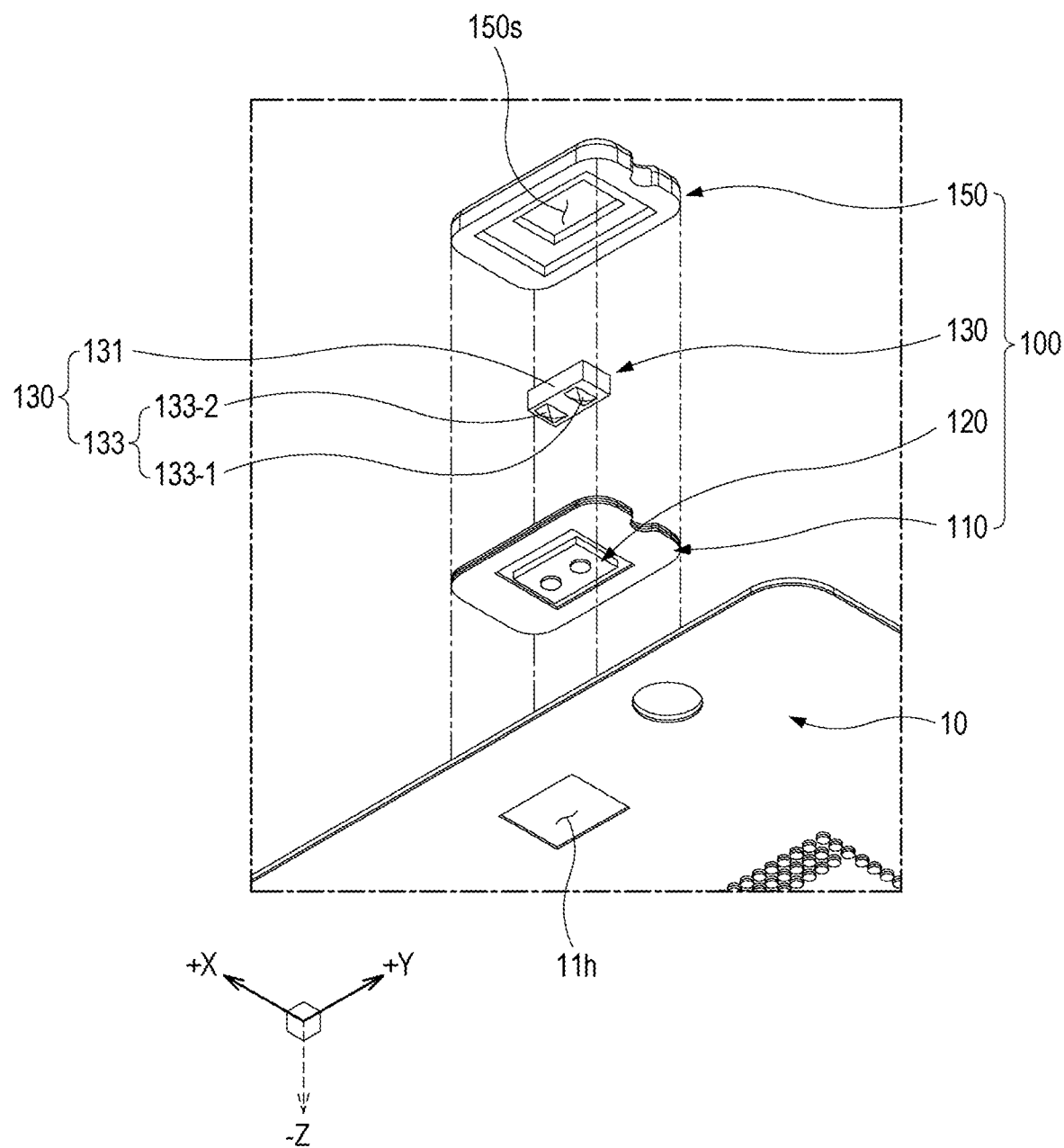
FIG. 5 is an exploded perspective view of the ID chip socket 100 of FIG. 4 viewed from another direction.

FIG. 4 is an exploded perspective view of the ID chip socket 100 of the test connector assembly 10 of FIG. 1. FIG. 5 is an exploded perspective view of the ID chip socket 100 of FIG. 4 viewed from another direction.

Referring to FIGS. 4 and 5, the frame 11 may include a plurality of layers stacked in the vertical direction. The plurality of layers may include at least one first layer 11b. And, the plurality of layers may include at least one second layer 11a below the at least one first layer 11b. The plurality of layers may include a plurality of first layers and/or a plurality of second layers. However, in the present embodiment, the plurality of layers may include one first layer 11b and one second layer 11a. For example, at least one second layer 11a may be an insulating film, and at least one first layer 11b may be a stainless steel (SUS) plate.

For example, the frame 11 may be composed of only a SUS plate. In another example, the frame 11 may be configured by covering only the lower side of the SUS plate with an insulating film, but the structure of the frame 11 may be implemented in various other ways.

A portion of the first layer 11b may be opened such that a portion 11c of the upper surface of the second layer 11a is exposed. A portion of the first layer 11b may be opened such that the contactor 110 of the ID chip socket 100 is fixed to the upper surface of the second layer 11a.

An exposure hole 11bh may be formed to vertically pass through the first layer 11b. The portion 11c of the second layer 11a may be exposed through the exposure hole 11bh. The contactor 110 of the ID chip socket 100 may be fixed to the portion 11c.

A connection hole 11h may be formed to vertically pass through the frame 11. The socket-conductive part 120 (socket-conductor 120) of the ID chip socket 100 may be connected to the connection counterpart 25 of the test equipment 20 through the connection hole 11h. The connection hole 11h is formed such that the lower end of the socket-conductive part 120 of the ID chip socket 100 is exposed to the lower side of the frame 11. The connection hole 11h may be formed in the central portion of the portion 11c.

Referring to FIGS. 4 and 5, the ID chip socket 100 includes a contactor 110 configured to be fixed to the upper side of the frame 11. The lower surface of the contactor 110 may be fixed to the upper side of the frame 11. The upper surface of the frame 11 may include the upper surface of the portion 11c of the second layer 11a, and the contactor 110 may be fixed to the upper surface of the portion 11c. The contactor 110 may be formed in a plate shape having a thickness in the vertical direction.

In one example, the contactor 110 may be bonded to the frame 11. The contactor 110 may be attached to the portion 11c of the second layer 11a using an adhesive such as epoxy.

In another example, the contactor 110 may be fixed to the portion 11c by an adhesive member (not illustrated) disposed between the contactor 110 and the portion 11c. The adhesive member may be made of an insulating material. An adhesive film (not illustrated) such as a piece of double-sided tape may be disposed between the contactor 110 and the portion 11c.

The ID chip socket 100 includes a socket-conductive part 120 penetrating the contactor 110 in the vertical direction. The socket-conductive part 120 enables energization in the vertical direction. The socket-conductive part 120 includes conductive members that are vertically connected. Electrical signals may be transmitted in at least one direction (upward and/or downward) along the socket-conductive part 120. The lower end of the socket-conductive part 120 is exposed downward through the connection hole 11h in the frame 11.

The ID chip socket 100 includes an ID chip 130 fixed to the upper side of the socket-conductive part 120. The ID chip 130 is electrically connected to the socket-conductive part 120. The ID chip 130 may be electrically connected to the upper end of the socket-conductive part 120.

The ID chip 130 includes a chip body 131 preset to execute at least one of the above-described identification function and history-tracking function. The chip body 131 may include various electronic devices.

The ID chip 130 includes a connection portion 133 that is electrically connected to the socket-conductive part 120. An electrical signal, which was sequentially passed from the test equipment 20 and the socket-conductive part 120, may be received through the connection portion 133, or an electrical signal may be sent from the ID chip 130 to the socket-conductive part 120. The chip body 131 may include a plurality of connection portions 133-1 and 133-2 corresponding to a plurality of penetration portions 121-1 and 121-2, to be described later, in the socket-conductive part 120.

The ID chip socket 100 includes a cover 150 that covers the upper surface of the ID chip 130. The cover 150 may be in contact with the upper surface of the ID chip 130, but in this embodiment, the cover 150 is spaced apart from the upper surface of the ID chip 130.

The cover 150 covers the side surfaces of the ID chip 130. The cover 150 may be in contact with the lateral surfaces of the ID chip 130, but in this embodiment, the cover 150 is spaced apart from the lateral surfaces of the ID chip 130.

The cover 150 has an inner space 150s formed therein. The ID chip 130 is accommodated in the inner space 150s. In the cover 150, the inner space 150s is open downward. The lower opening of the inner space 150s of the cover 150 is covered by the contactor 110.

The cover 150 is configured to be fixed to at least one of the contactor 110 and the frame 11. According to an embodiment, the cover 150 may be fixed to the contactor 110, or may be fixed to the frame 11.

Figure 6A:
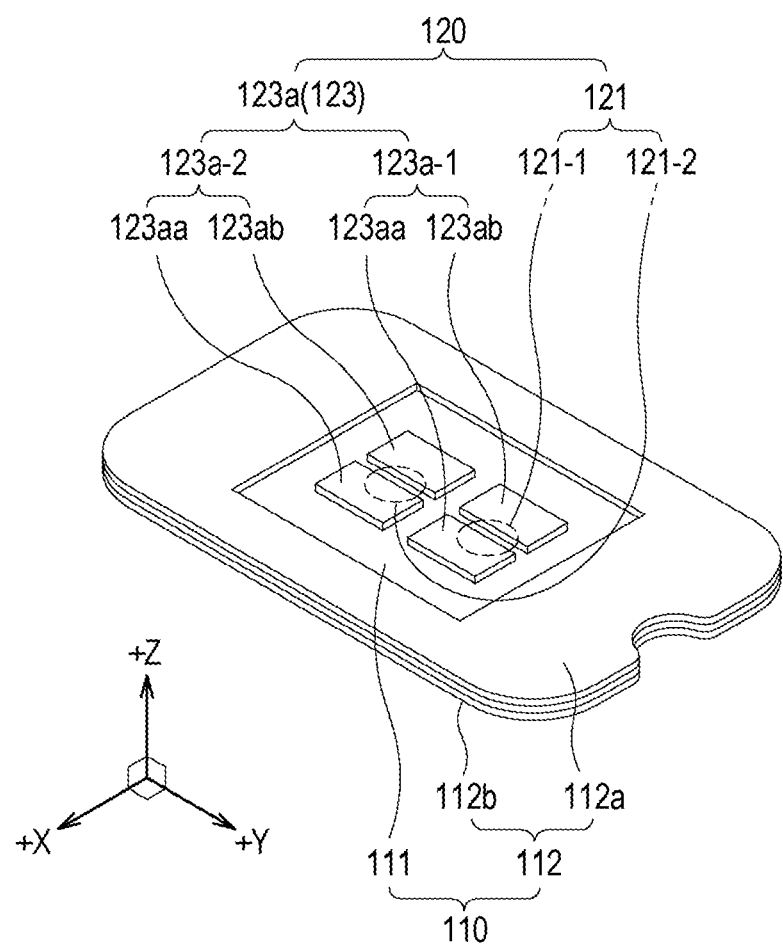
Figure 6B:
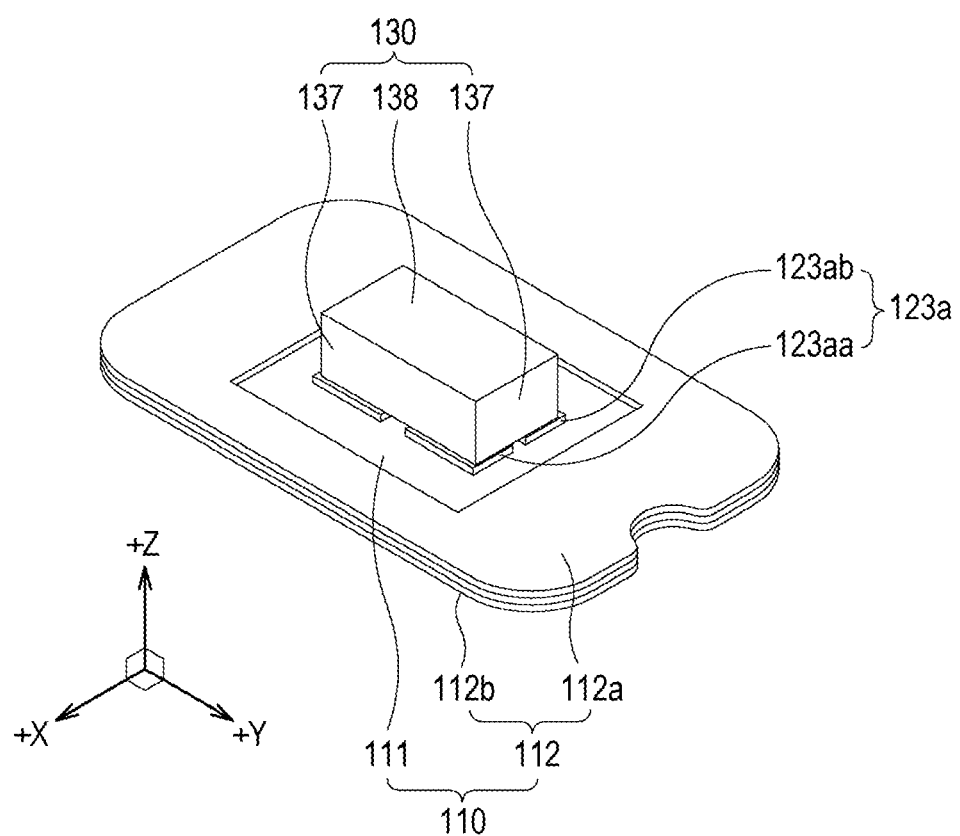
Figure 7:
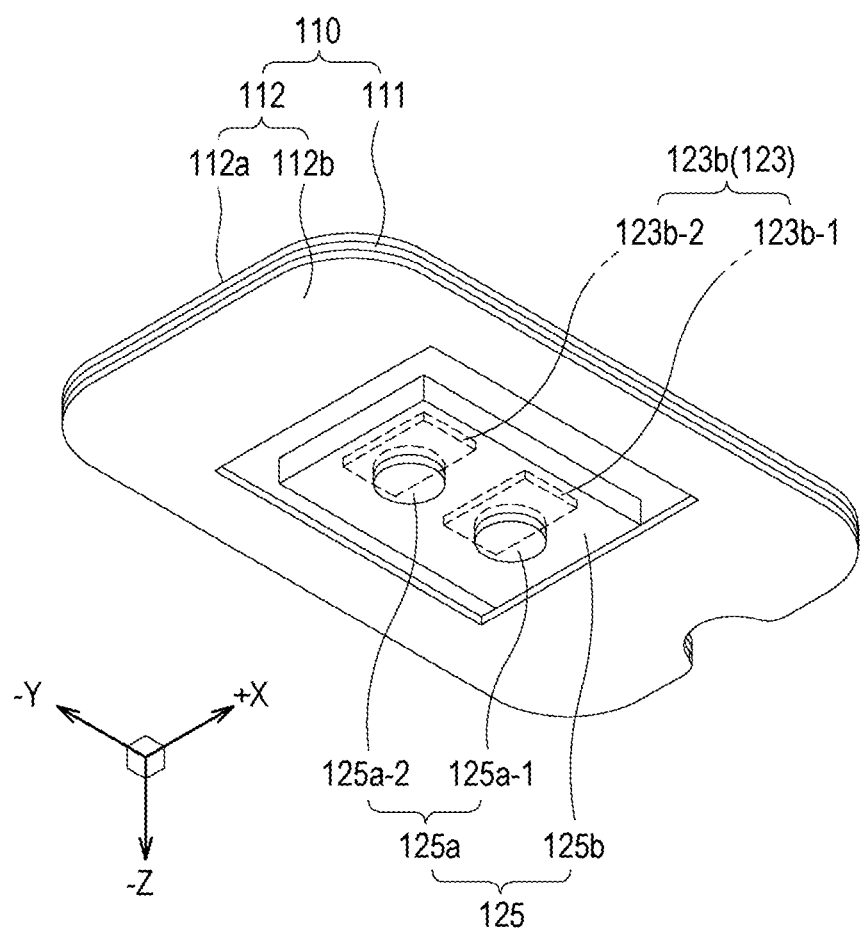
FIG. 7 is a perspective view of the assembly of FIG. 6A viewed from another direction.

FIGS. 6A and 6B are perspective views illustrating components of the ID chip socket 100, in which FIG. 6A is a perspective view illustrating an assembly of a contactor 110 and a socket conductive part 120, and FIG. 6B is a perspective view illustrating an assembly in which an ID chip 130 is added to the assembly of FIG. 6A. FIG. 7 is a perspective view of the assembly of FIG. 6A viewed from another direction.

Referring to FIGS. 6A, 6B and 7, the contactor 110 includes a base plate 111 made of an insulating material. The base plate 111 may be formed in a plate shape having a thickness in the vertical direction. For example, the base plate 111 may be formed of a plastic material.

The contactor 110 may include cover plates 112 attached to the surfaces of the base plate 111. The cover plates 112 may include an upper cover plate 112a attached to the upper surface of the base plate 111. The cover plates 112 may include a lower cover plate 112b attached to the lower surface of the base plate 111.

The cover plates 112 are spaced apart from the socket-conductive part 120. The cover plates 112 are disposed corresponding to the peripheral portion of the base plate 111. The upper cover plate 112a is spaced apart from an upper conductive plate 123a and surrounds the periphery of the upper conductive plate 123a. The lower cover plate 112b is spaced apart from a lower conductive plate 123b and surrounds the lower conductive plate 123b.

The socket-conductive part 120 includes a penetration portion 121 made of a conductive material and penetrating the base plate 111 in the vertical direction. For example, the penetration portion 121 may include a nickel (Ni) material. As an example of a manufacturing method, the penetration portion 121 may be formed by forming a hole vertically communicating with a base plate 111, and then filling the hole in the base plate 111 with nickel.

The socket-conductive part 120 may include a plurality of penetration portions 121-1 and 121-2. The plurality of penetration portions 121-1 and 121-2 may be laterally spaced apart from each other. By providing the plurality of penetration portions 121-1 and 121-2, it is possible to reduce the likelihood of occurrence of malfunction of the socket-conductive part 120.

The socket-conductive part 120 may include a conductive plate 123, which is made of a conductive material and is in contact with the penetration portions 121. Conductive plates 123 may be disposed at the vertically opposite ends of the penetration portions 121, respectively. The conductive plates 123 may be attached to the surfaces of the base plate 111. The conductive plates 123 may prevent the penetration portions 121 from separating from the base plate 111. For example, the conductive plates 123 may be made of a copper foil.

The conductive plates 123 include an upper conductive plate 123a disposed between the upper end of the penetration portion 121 and the ID chip 130 and configured to be conductive. The upper conductive plate 123a is brought into contact with the upper end of the penetration portion 121. The upper conductive plate 123a is fixed to the upper surface of the base plate 111.

The upper conductive plate 123a may include a plurality of upper conductive plates 123a-1 and 123a-2 corresponding to the plurality of penetration portions 121-1 and 121-2. The plurality of upper conductive plates 123a-1 and 123a-2 are disposed to be spaced apart from each other. A first upper conductive plate 123a-1 is in contact with the upper end of the first penetration portion 121-1 and a second upper conductive plate 123a-2 is in contact with the upper end of the second penetration portion 121-2.

The upper conductive plate 123a may include a plurality of upper conductive plates 123aa and 123ab separated from each other and corresponding to one penetration portion 121-1 or 121-2. Two upper conductive plates 123aa and 123ab, which are in contact with one penetration portion 121-1 or 121-2 and are spaced apart from each other, may be provided. Specifically, a plurality of upper conductive plates 123aa and 123ab, which are in contact with the first penetration portion 121-1, may be provided, and a plurality of upper conductive plates 123aa and 123ab, which are in contact with the second penetration portion 121-2, may be provided. By providing the plurality of upper conductive plates 123aa and 123ab, the ID chip 130 can be easily disposed at a predetermined position, and a part of the connection portion 133 of the ID chip 130 is interposed between the plurality of upper conductive plates 123aa and 123ab, so that the electrical connection and physical bonding of the ID chip 130 can be improved.

In this embodiment, the first upper conductive plate 123a-1 includes a plurality of upper conductive plates 123aa and 123ab, and the second upper conductive plate 123a-2 includes a plurality of upper conductive plates 123aa and 123ab. The first upper conductive plate 123a-1 and the second upper conductive plate 123a-2 are spaced from each other in the Y-axis direction, and the plurality of upper conductive plates 123aa and 123ab are spaced apart from each other in the X-axis direction.

The conductive plates 123 include a lower conductive plate 123b disposed at the lower end of the penetration portion 121 and configured to be conductive. The lower conductive plate 123b is brought into contact with the lower end of the penetration portion 121. The lower conductive plate 123b is fixed to the lower surface of the base plate 111. The lower conductive plate 123b may be disposed between the lower end of the penetration portion 121 and the contact pads 125. The lower conductive plate 123b may be in contact with the upper end of the pad-conductive part 125a (pad-conductor 125a) of a contact pad 125. The lower conductive plate 123b may be covered by the contact pad 125.

The lower conductive plate 123b may include a plurality of lower conductive plates 123b-1 and 123b-2 corresponding to the plurality of penetration portions 121-1 and 121-2. The plurality of lower conductive plates 123b-1 and 123b-2 are disposed to be spaced apart from each other in the Y-axis direction. The first lower conductive plate 123b-1 is brought into contact with the lower end of the first penetration portion 121-1 and the second lower conductive plate 123b-2 is brought into contact with the lower end of the second penetration portion 121-2.

The cover plate 112 of the contactor 110 and the conductive plate 123 of the socket-conductive part 120 may constitute a part of the integral plate material in the manufacturing process. For example, the surface of the base plate 111 may be plated to form an integral plate material. A part of one plate material of a conductive material may be cut out to form an upper cover plate 112a and an upper conductive plate 123a, and a part of the upper surface of the base plate 111 may be exposed through the cut-out portion. A part of one plate material of a conductive material may be cut out to form a lower cover plate 112b and a lower conductive plate 123b, and a part of the lower surface of the base plate 111 may be exposed through the cut-out portion of the plate material.

The socket-conductive part 120 includes a contact pad 125 fixed to the lower side of the contactor 110. The contact pad 125 is configured to be capable of being brought into contact with the test equipment 20. The contact pad 125 may transmit an electrical signal between the conductive plate 123 and the connection counterpart 25 of the test equipment 20.

The contact pad 125 may be configured to be elastically deformable. The contact pad 125 may be configured to be elastically compressively deformable in the vertical direction.

The contact pad 125 includes a sheet 125b of an elastically deformable insulating material. The sheet 125b may support the pad-conductive part 125a. A single sheet 125b for supporting a plurality of pad-conductive parts 125a-1 and 125b-2 may be provided. The sheet 125b may include a silicon material. The sheet 125b may cover the plurality of lower conductive plates 123b-1 and 123b-2.

The contact pad 125 includes a pad-conductive part 125a extending in the vertical direction within the sheet 125b. The pad-conductive part 125a enables energization in the vertical direction. The upper end of the pad-conductive part 125a is in contact with the lower conductive plate 123b. The lower end of the pad-conductive part 125a is exposed to the lower side of the contact pad 125.

The pad-conductive part 125a may include a plurality of conductive particles. One pad-conductive part 125a extending vertically may include a plurality of conductive particles arranged vertically. The plurality of conductive particles may be in contact with each other to transmit an electrical signal. The plurality of conductive particles may be supported by the sheet 125b.

The pad-conductive part 125a may include a plurality of pad-conductive parts 125a-1 and 125a-2 corresponding to the plurality of penetration portions 121-1 and 121-2. The plurality of pad-conductive parts 125a-1 and 125a-2 are disposed such that they are spaced apart from each other in the Y-axis direction. The first pad-conductive part 125a-1 is in contact with the lower end of the first lower conductive plate 123b-1, and the second pad-conductive part 125a-2 is in contact with the lower end of the second lower conductive plate 123b-2.

Figure 8A:
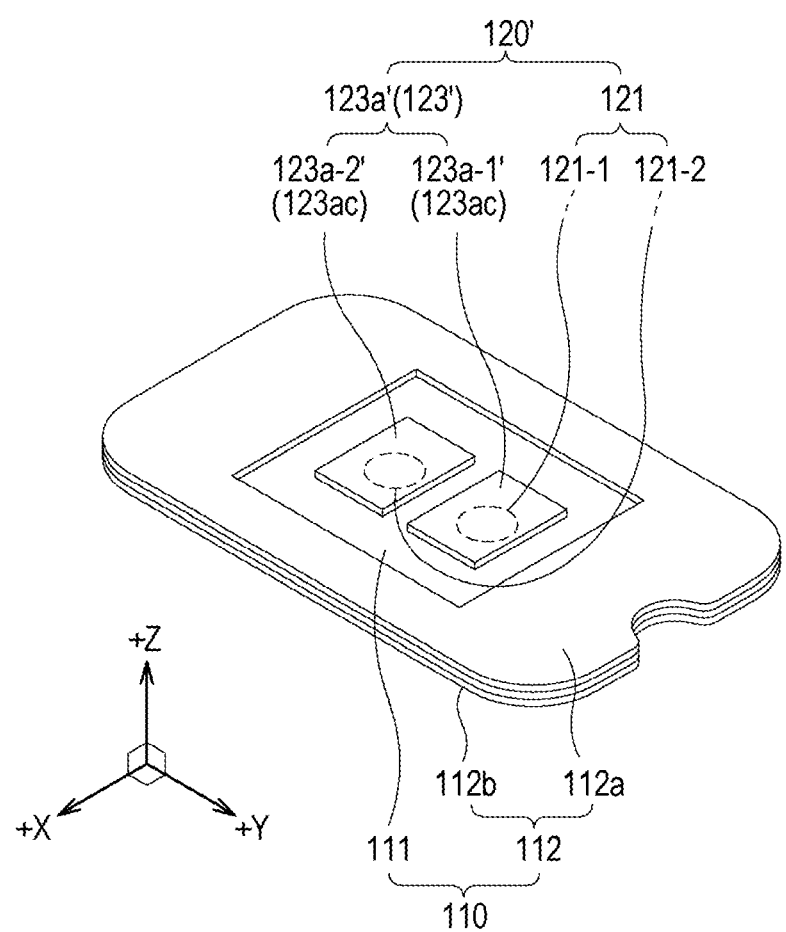
Figure 8B:
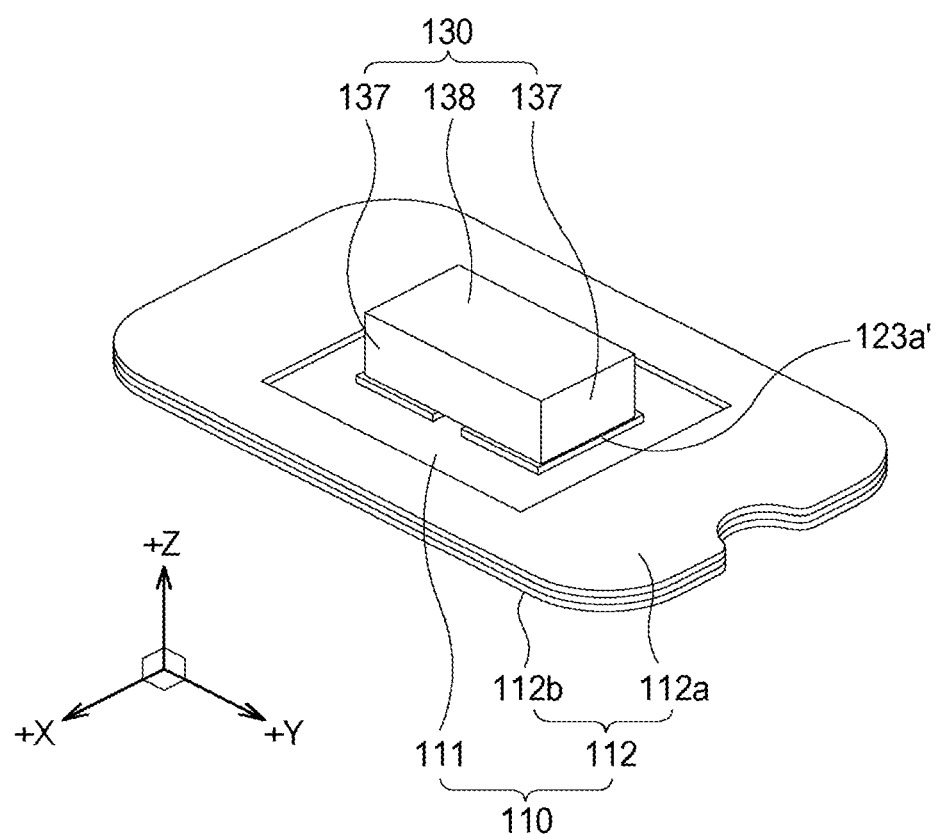

FIGS. 8A and 8B are perspective views illustrating components of the ID chip socket 100. FIG. 8A is a perspective view illustrating an assembly of the contactor 110 and a socket conductive part 120' according to another embodiment, and FIG. 8B is a perspective view illustrating an assembly in which an ID chip 130 is added to the assembly of FIG. 8A.

Referring to FIG. 8, a socket-conductive part 120' according to another embodiment includes an integral upper conductive plate 123ac corresponding to one penetration portion 121-1 or 121-2. That is, there is no separated upper conductive plate corresponding to one penetration portion 121-1 or 121-2.

The upper conductive plate 123a' may include a plurality of upper conductive plates 123a-1' and 123a-2' corresponding to the plurality of penetration portions 121-1 and 121-2. In this embodiment, the first upper conductive plate 123a-1' consists of a single upper conductive plate 123ac, and the second upper conductive plate 123a-2' is consists of a single upper conductive plate 123ac. The first upper conductive plate 123a-1' and the second upper conductive plate 123a-2' are spaced apart from each other in the Y-axis direction. Each connection portion 133 of the ID chip 130 is in contact with the upper conductive plate 123c.

Figure 9:
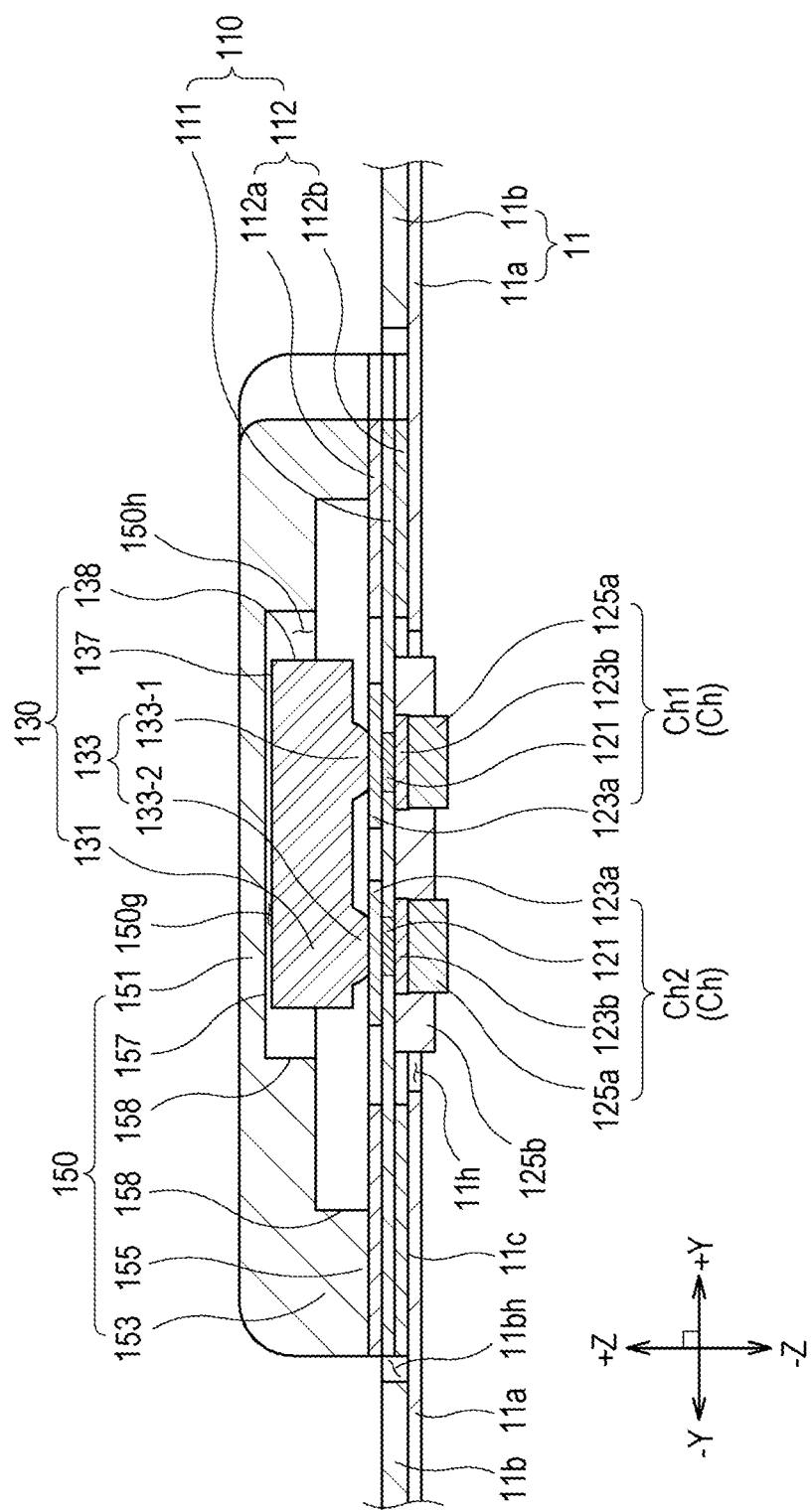
FIG. 9 is a cross-sectional view of the ID chip socket 100 and the frame 11 of FIG. 2 taken along line S1-S1', in which the ID chip socket 100 according to the first embodiment is illustrated.
Figure 10:
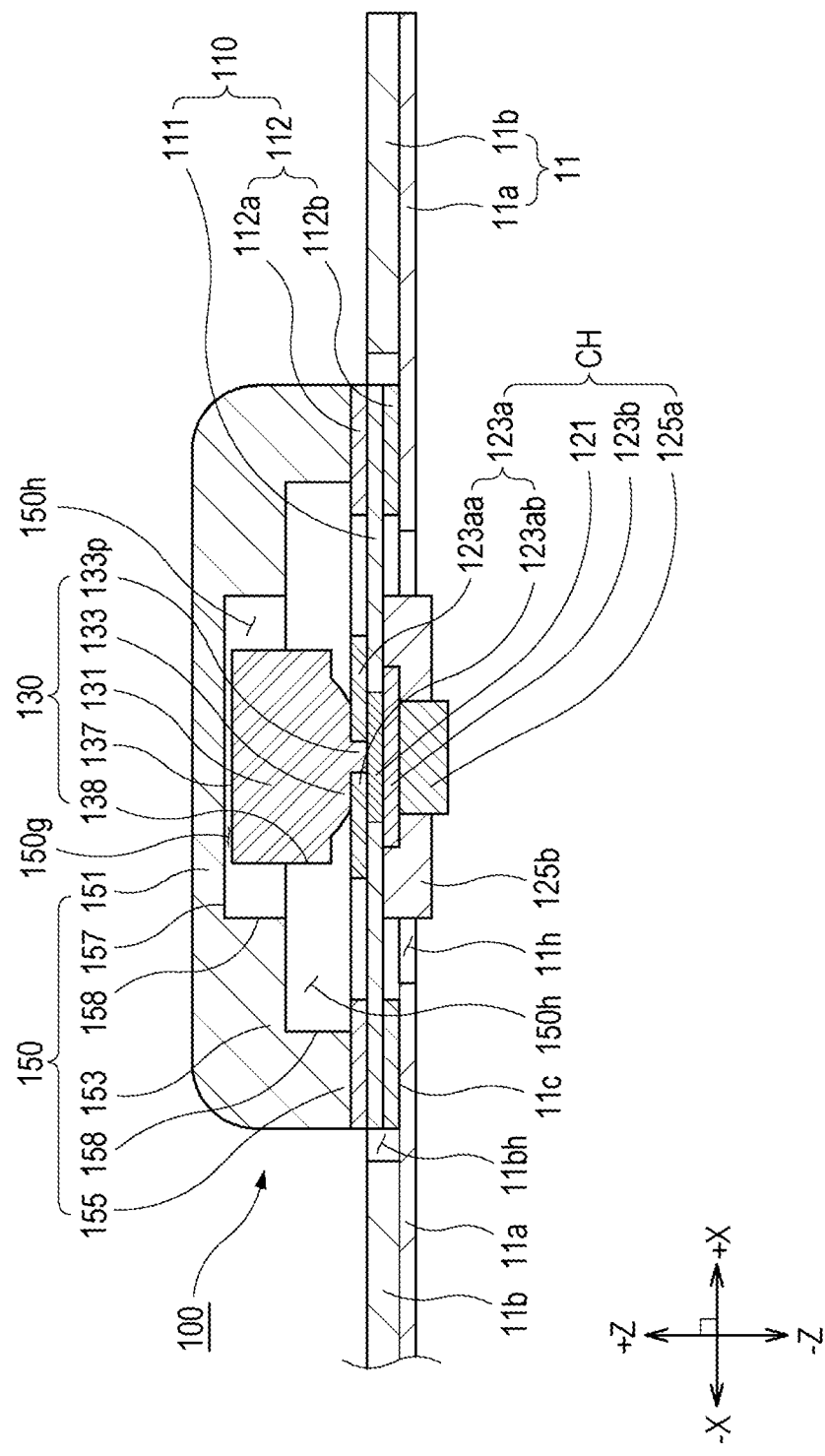
FIG. 10 is a cross-sectional view of the ID chip socket 100 and the frame 11 of FIG. 2 taken along line S2-S2', in which the ID chip socket 100 according to the first embodiment is illustrated.

FIG. 9 is a cross-sectional view of the ID chip socket 100 and the frame 11 of FIG. 2 taken along line S1-S1', in which the ID chip socket 100 according to the first embodiment is illustrated. FIG. 10 is a cross-sectional view of the ID chip socket 100 and the frame 11 of FIG. 2 taken along line S2-S2', in which the ID chip socket 100 according to the first embodiment is illustrated.

Referring to FIGS. 9 and 10, the socket-conductive part 120 of the ID chip socket 100 includes a conductive channel Ch that electrically connects the ID chip 130 and the test equipment 20. A plurality of conductive channels Ch1 and Ch2 corresponding to the plurality of connection portions 133-1 and 133-2 of the ID chip 130 may be provided. The first conductive channel Ch1 is connected to the first connection portion 133-1 of the ID chip 130 and the second conductive channel Ch2 is connected to the second connection portion 133-2 of the ID chip 130.

The conductive channel Ch includes a section in which an upper conductive plate 123a, a penetration portion 121, and a lower conductive plate 123b are sequentially connected. A pad-conductive part 125a may be positioned on the lower portion of the conductive channel Ch.

The upper conductive plate 123a, the penetration portion 121, the lower conductive plate 123b, and the pad-conductive part 125a may be sequentially connected from the upper side to the lower side to form one conductive channel Ch. The upper end of the upper conductive plate 123a is connected to the connection portion 133 of the ID chip 130. The upper end of the penetration portion 121 is connected to the lower end of the upper conductive plate 123a. The upper end of the lower conductive plate 123b is connected to the lower end of the penetration portion 121. The upper end of the pad-conductive part 125a is connected to the lower end of the lower conductive plate 123b.

The ID chip 130 may be fixed to the socket-conductive part 120. The ID chip 130 may be fixed to the socket-conductive part 120 and the contactor 110.

The chip body 131 of the ID chip 130 may include a Radio Frequency Identification (RFID) chip. The chip body 131 may include an IC chip and/or a PCB.

The ID chip 130 may be fixed to the socket-conductive part 120 by the connection portion 133 of the ID chip 130. For example, the connection portion 133 may be configured as a Surface Mount Technology (SMT) bonding type. The connection portion 133 may be configured as an O2 soldering type.

The ID chip 130 includes an upper surface 137 that faces upward. The upper surface 137 faces the inner downwardly-facing surface 157 of the cover 150.

The ID chip 130 includes lateral surfaces 138. The lateral surfaces 138 face the inner lateral surfaces 158 of the cover 150.

A plurality of connection portions 133-1 and 133-2 corresponding to the plurality of conductive channels Ch1 and Ch2 may be provided. The plurality of connection portions 133-1 and 133-2 may be disposed to be spaced apart from each other in the Y-axis direction.

The connection portion 133 includes a portion 133p interposed between the plurality of upper conductive plates 123aa and 123ab, which are in contact with one penetration portion 121. The portion 133p of the connection portion 133 is laterally in contact with the plurality of upper conductive plates 123aa and 123ab. The portion 133p of the connection portion 133 may be in contact with the penetrating portion 121 at the lower side thereof.

The cover 150 may be formed of an insulating material. In this embodiment, the cover 150 may be formed of a plastic material.

The cover 150 may be spaced apart from the ID chip 130 in the vertical direction. The upper surface 137 of the ID chip 130 and the inner downwardly-facing surface 157 of the cover 150 may be disposed to form a vertical gap 150g therebetween. The vertical length of the vertical gap 150g may be smaller than the vertical length of the ID chip 130. Thus, when pressure or an impact is applied to the cover 150 in the vertical direction, it is possible to prevent or reduce the transmission of a load or an impact to the ID chip 130. In particular, even when the cover 150 is pushed downward by a guide member 50 in the environment where it is used to be described later with reference to FIG. 15, the downward load of the guide member 50 may not be applied to the ID chip 130.

The cover 150 may be laterally spaced apart from the ID chip 130. The lateral surfaces 138 of the ID chip 130 and the inner lateral surfaces 158 of the cover may be arranged to form a lateral gap 150h therebetween. Thus, even when pressure or an impact is laterally applied to the cover 150 through the side gap 150h, it is possible to prevent or reduce the transmission of a load or an impact to the ID chip 130.

The vertical gap 150g may be filled with air or a material that is more flexible than the material of the cover 150. In an example, the vertical gap 150g may be filled with air without any other separate component. In another example, the vertical gap 150g may be filled with a material that is more flexible than the material of the cover 150. The material that is more flexible than the material of the cover 150 may include an epoxy material.

In addition, the lateral gap 150h may be filled with air or a material that is more flexible than the material of the cover 150. An example of the material filling the lateral gap 150h is the same as the example of the material filling the vertical gap 150g described above.

The cover 150 includes an upper portion 151 that covers the upper surface 137 of the ID chip 130. The lower surface of the upper portion 151 forms an inner downwardly-facing surface 157.

The cover 150 includes a lateral portion 153 surrounding the lateral surfaces 138 of the ID chip 130. One lateral surface of the lateral portion 153 forms an inner lateral surface 158. The upper end of the lateral portion 153 is connected to the upper portion 151.

The cover 150 includes an attachment portion 155 that is fixed to at least one of the contactor 110 and the frame 11 at a lower portion of the lateral portion 153. The attachment portion 155 of the cover 150 according to the first embodiment described with reference to FIGS. 9 and 10 is fixed to the contactor 110. Attachment portions 155' and 155" of the covers 150' and 150" according to the second and third embodiments, which will be described later with reference to FIGS. 11 and 12, are fixed to the frame 11.

In the first embodiment, the attachment portion 155 may be fixed to the upper surface of the contactor 110. The attachment portion 155 may be fixed to an edge portion of the upper surface of the contactor 110. The attachment portion 155 may be fixed to the upper cover plate 112a of the contactor 11.

Figure 11:
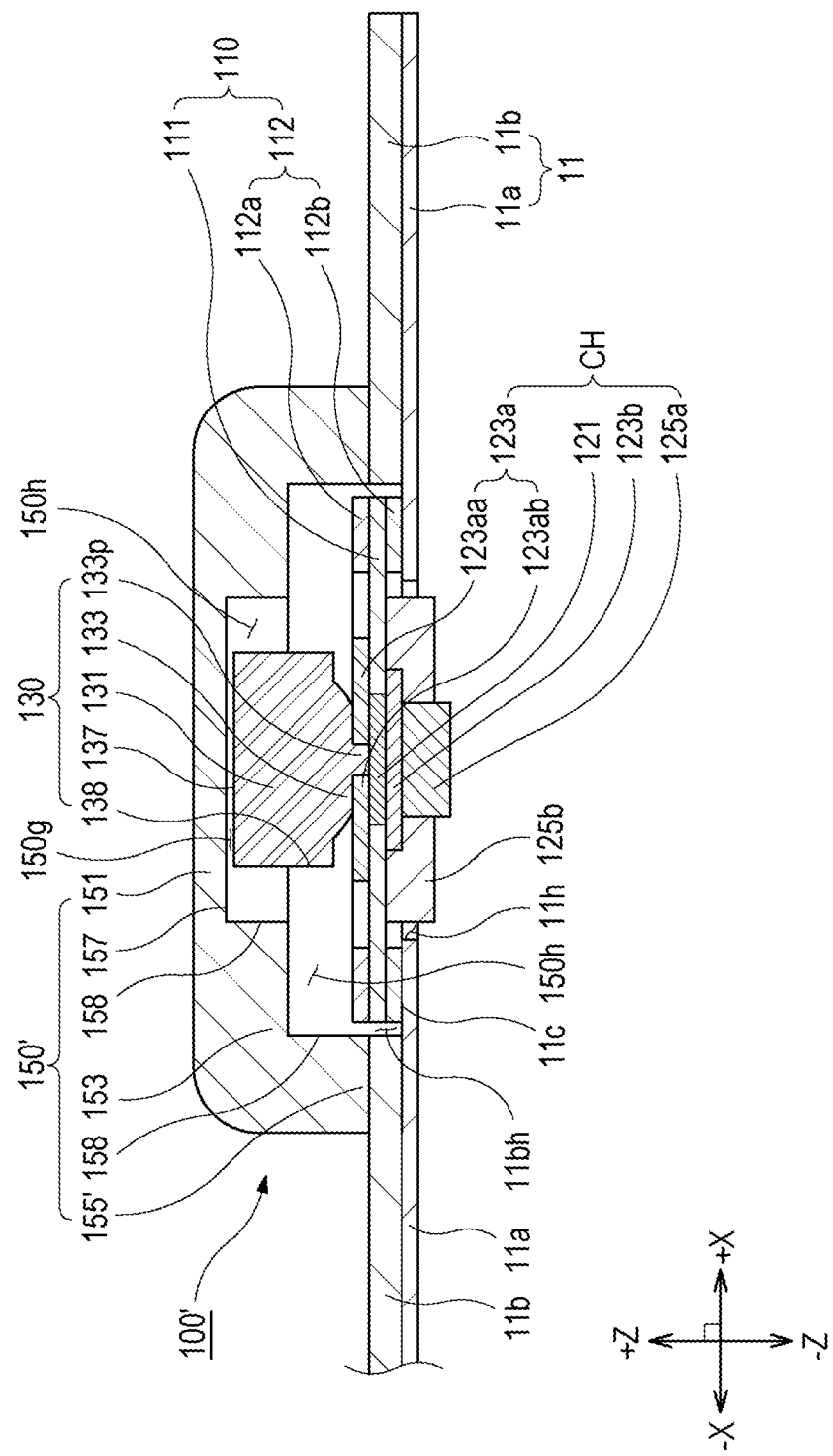
FIG. 11 is a cross-sectional view of an ID chip socket 100' and a frame 11 according to a second embodiment, taken in the same manner as FIG. 10.
Figure 12:
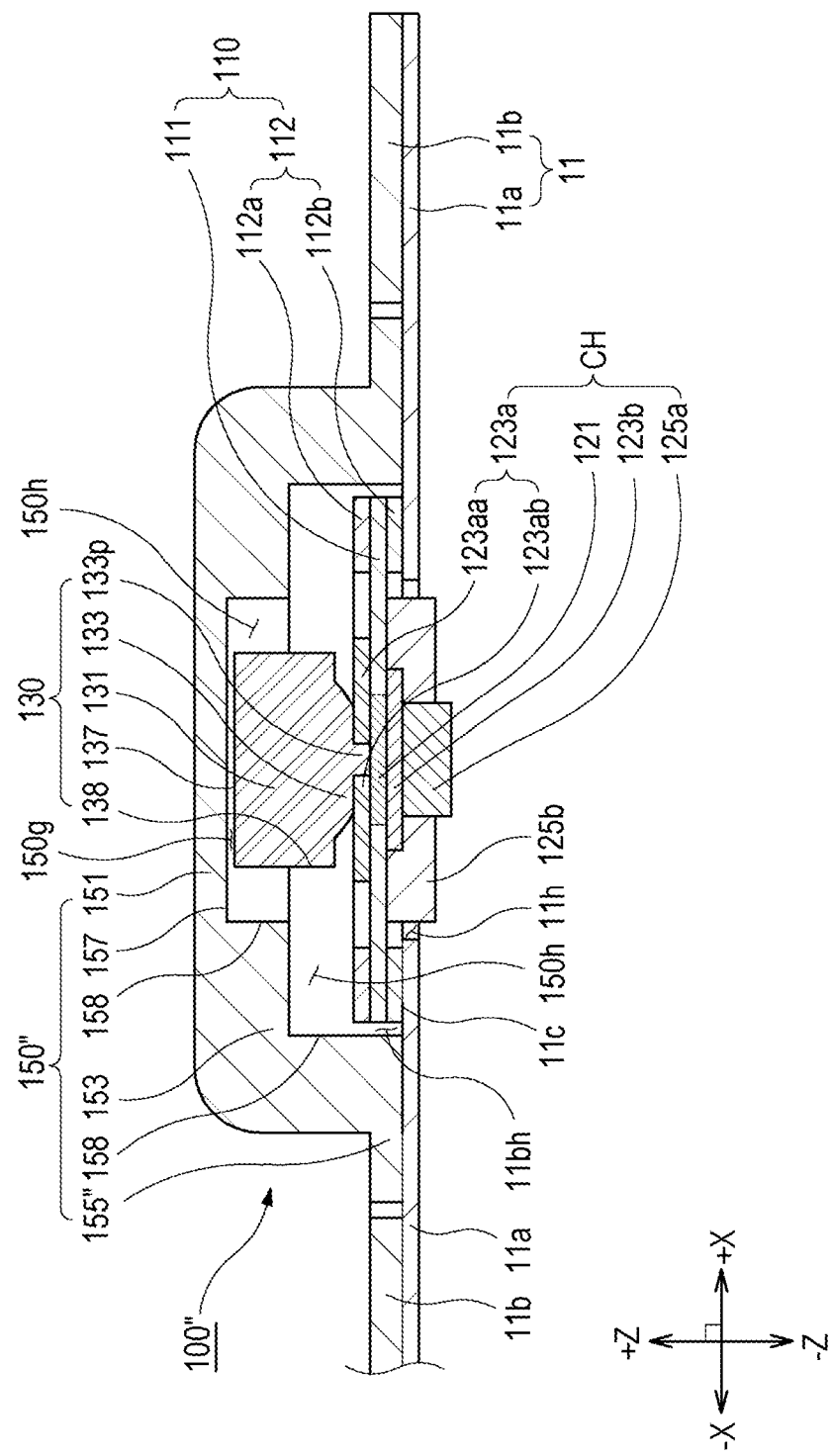
FIG. 12 is a cross-sectional view of an ID chip socket 100" and a frame 11 according to a third embodiment, taken in the same manner as FIG. 10.

FIG. 11 is a cross-sectional view of an ID chip socket 100' and a frame 11 according to a second embodiment, taken in the same manner as FIG. 10. The ID chip socket 100' according to the second embodiment will be described with reference to FIG. 11, focusing on differences from the ID chip socket 100 according to the first embodiment described above.

The attachment portion 155' of the cover 150' of the ID chip socket 100' according to the second embodiment is fixed to the upper surface of the frame 11. The attachment portion 155' is fixed to the upper surface of a first layer 11b of the frame 11. A portion 11c of the second layer 11a exposed through the exposure hole 11bh is separated from the attachment portion 155'. The cover 150' may be spaced apart from the contactor 110. Of the cover 150 and the contactor 110, only the contactor 110 may be brought into contact with the portion 11c. A portion of the first layer 11b is opened such that the contactor 110 is fixed to the upper surface of the second layer 11a.

FIG. 12 is a cross-sectional view of an ID chip socket 100" and a frame 11 according to a third embodiment, taken in the same manner as FIG. 10. The ID chip socket 100" according to the third embodiment will be described with reference to FIG. 12, focusing on differences from the ID chip socket 100 according to the first embodiment described above.

The attachment portion 155" of the cover 150" of the ID chip socket 100" according to the third embodiment is fixed to the upper surface of the second layer 11a. The attachment portion 155" is fixed to a portion 11c of the second layer 11a exposed through the exposure hole 11bh. The cover 150" may be spaced apart from the contactor 110. The cover 150 and the contactor 110 may be brought into contact with the portion 11c. A portion of the first layer 11b is opened such that the cover 150" is fixed to the upper surface of the second layer 11a.

Each of the contactor 110 and the cover 150" may be fixed to the portion 11c. A portion of the first layer 11b is opened such that the contactor 110 and the cover 150" are fixed to the upper surface of the second layer 11a.

The attachment portion 155" may extend laterally to protrude from the outer surface of the lateral portion 153. The lateral length of the attachment portion 155" may be longer than the lateral length of the lateral portion 153.

When a load or an impact is applied to the cover 150 from the outside through the attachment positions of the covers 150' and 150" according to the second and third embodiments, it is possible to prevent direct transmission of the load or the impact of the cover 150 to the contactor 110. In particular, with the cover 150" according to the third embodiment, since the lateral movement of the cover 150" is restricted by the first layer 11b, the cover 150" can be more stably disposed.

Figure 13:
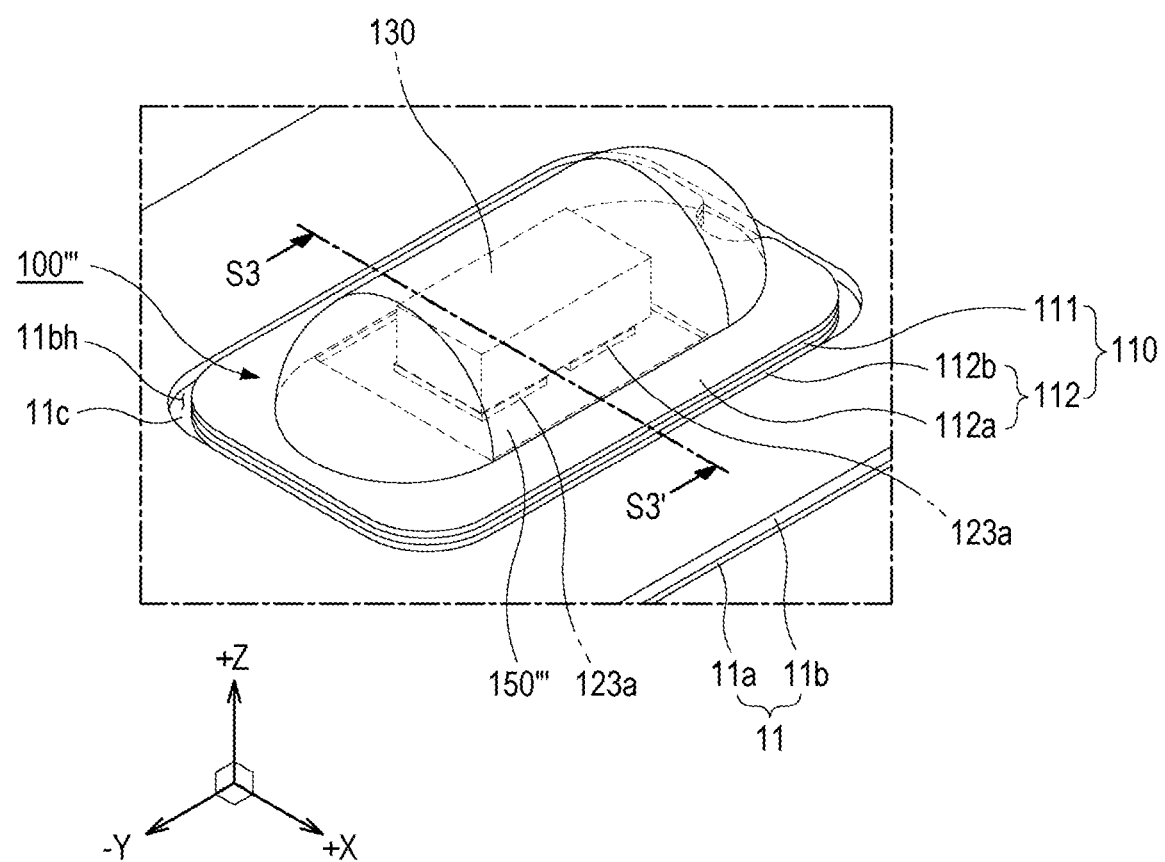
FIG. 13 is a perspective view of an ID chip socket 100''' and a frame 11 according to a fourth embodiment.
Figure 14:
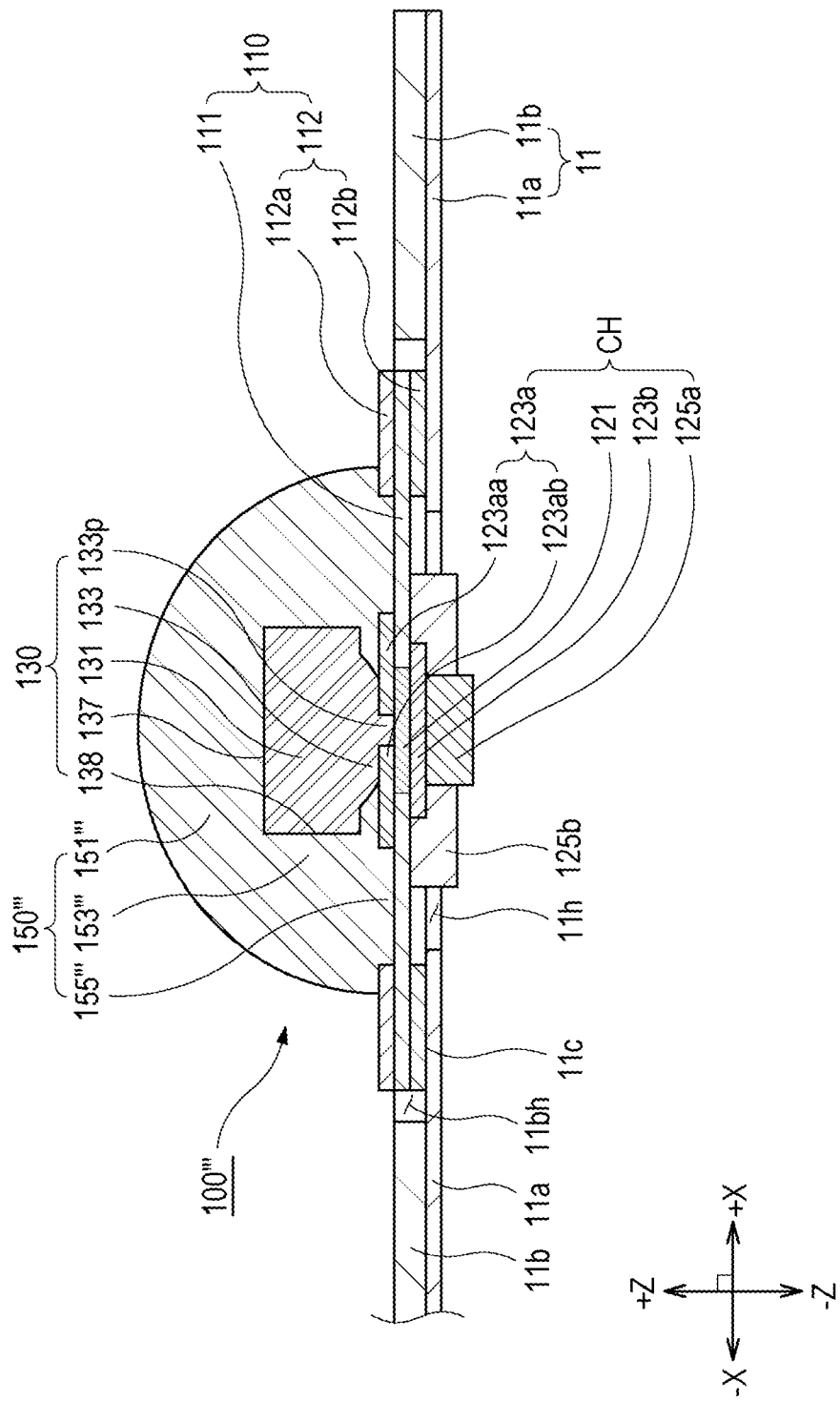
FIG. 14 is a cross-sectional view of the ID chip socket 100''' and the frame 11 of FIG. 13 taken along line S3-S3.

FIG. 13 is a perspective view of an ID chip socket 100''' and a frame 11 according to a fourth embodiment. FIG. 14 is a cross-sectional view of the ID chip socket 100''' and the frame 11 of FIG. 13 taken along line S3-S3'. The ID chip socket 100''' according to the fourth embodiment will be described with reference to FIGS. 13 and 14, focusing on differences from the ID chip socket 100 according to the first embodiment described above.

The cover 150''' of the ID chip socket 100''' according to the fourth embodiment may be made of a material that is more flexible than a plastic material. The cover 150''' may be formed of a silicon material. The cover 150''' may be formed by coating the ID chip 130 with a silicon material. Thus, a load or an impact applied to the cover 150''' from the outside may be more effectively absorbed by the cover 150'''.

The outer surface of the cover 150''' may form a curved surface. The outer upper surface and side surface of the cover 150''' may be connected with a rounded curvature therebetween.

The cover 150''' may be attached to the contactor 110. The cover 150''' may be attached to the ID chip 130. The cover 150''' and the ID chip 130 are vertically in contact with each other. The cover 150''' and the ID chip 130 are laterally in contact with each other.

Figure 15:
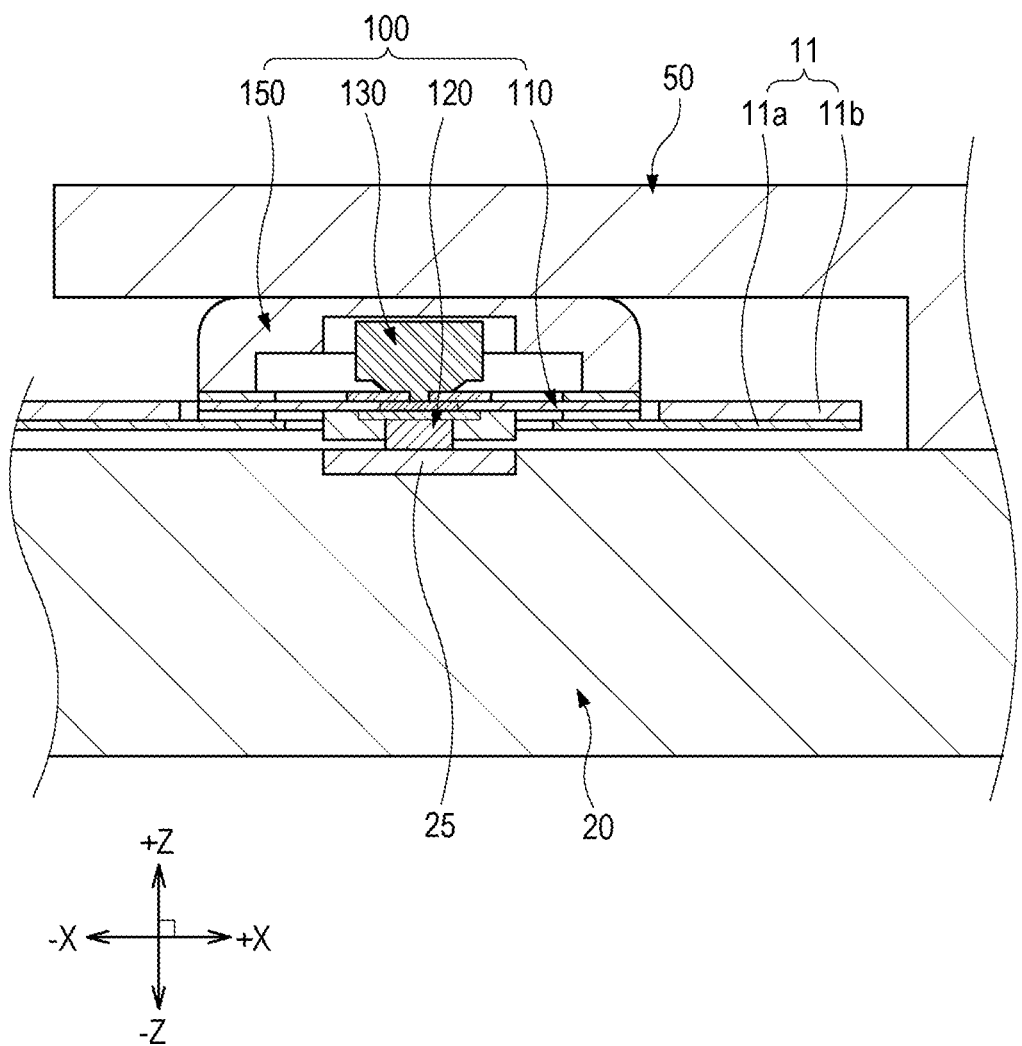
FIG. 15 is a cross-sectional view taken in the same manner as FIG. 10, in which a guide member 50 guiding the test connector assembly 10 in the state in which the test connector assembly 10 of FIG. 1 is coupled to the test equipment 20 is illustrated.

FIG. 15 is a cross-sectional view taken in the same manner as FIG. 10, in which a guide member 50 guiding the test connector assembly 10 in the state in which the test connector assembly 10 of FIG. 1 is coupled to the test equipment 20 is illustrated.

Referring to FIG. 15, the guide member 50 may be provided in the environment where the test equipment 20 is used. The guide member 50 is able to serve to push the ID chip socket 100 downward when the test connector assembly 10 is put on the test equipment 20. The ID chip socket 100 may be smoothly connected to the connection counterpart 25 of the test equipment 20 by the guide member 50 pushing the ID chip socket 100 downward.

The guide member 50 may also guide the positioning of the test connector assembly 10 relative to the test equipment 20. In addition, the guide member 50 may also facilitate the connection between the connector 13 of the test connector assembly 10 and the terminals 21 of the test equipment 20.

According to the embodiments of the present disclosure, the guide member 50 pushes the cover 150 downward, thereby guiding smooth connection between the ID chip socket 100 and the connection counterpart 25 of the test equipment 20 and preventing the load applied to the cover 150 by the guide member 50 from being transmitted to the ID chip 130.

According to the present disclosure in some embodiments, it is possible to accurately determine the time to replace a test connector assembly. Thus, it is possible to prevent a good-quality device to be inspected from being handled as a defective one due to failure the test connector assembly. According to the present disclosure in some embodiments, it is possible to replace a socket during a pause time by precisely predicting the time to replace the test connector assembly, thereby preventing or reducing adverse effects on production yield. According to the present disclosure in some embodiments, it is possible to prevent or reduce a load or an impact applied to the ID chip that performs the function of an ID chip socket using the cover.

Although the present disclosure has been described in relation to some embodiments, it should be noted that there may be various modifications and changes without departing from the spirit and scope of the present disclosure, which can be understood by those skilled in the art. In addition, such modifications and changes should be construed to belong to the scope of the claims appended herein.

What is claimed is:

1. An ID (identification) chip socket fixed to a frame that supports a connector of a test connector assembly, the ID chip socket comprising:
a contactor configured to be fixed to an upper side of the frame;
a socket-conductive part penetrating the contactor in a vertical direction and configured to enable electrical connection in the vertical direction;
an ID chip fixed to an upper side of the socket-conductive part and electrically connected to the socket-conductive part; and
a cover configured to cover an upper surface of the ID chip and to be fixed to at least one of the contactor and the frame.

2. The ID chip socket of claim 1, wherein the upper surface of the ID chip and an inner downwardly-facing surface of the cover are disposed to form a vertical gap between the upper surface of the ID chip and the inner downwardly-facing surface of the cover.

3. The ID chip socket of claim 2, wherein the vertical gap is filled with air or a material that is more flexible than a material of the cover.

4. The ID chip socket of claim 2, wherein a lateral surface of the ID chip and an inner lateral surface of the cover are disposed to form a lateral gap between the lateral surface of the ID chip and the inner lateral surface of the cover.

5. The ID chip socket of claim 1, wherein the cover comprises:
an upper portion that covers the upper surface of the ID chip;
a lateral portion that covers a lateral surface of the ID chip; and
an attachment portion fixed to at least one of the contactor and the frame below the lateral portion.

6. The ID chip socket of claim 1, wherein the cover is formed by coating the ID chip with a silicon material.

7. The ID chip socket of claim 1, wherein the contactor comprises a base plate made of an insulating material, and
wherein the socket-conductive part comprises:
a penetration portion made of a conductive material and vertically penetrating the base plate;
at least one upper conductive plate disposed between an upper end of the penetration portion and the ID chip to enable electrical connection, the at least one upper conductive plate being fixed to an upper surface of the base plate; and
a lower conductive plate disposed at a lower end of the penetration portion to enable electrical connection, the lower conductive plate being fixed to a lower surface of the base plate.

8. The ID chip socket of claim 7, wherein the at least one upper conductive plate comprises two upper conductive plates which are in contact with one of the penetration portion and are spaced apart from each other.

9. The ID chip socket of claim 1, wherein the socket-conductive part comprises a contact pad fixed to a lower side of the contactor and configured to be brought into contact with a test equipment, and
wherein the contact pad comprises:
a sheet made of an elastically deformable insulating material; and
a pad-conductive part extending in the sheet in the vertical direction to enable electrical connection in the vertical direction.

10. The ID chip socket of claim 1, wherein the ID chip stores at least one of identification information and history information,
wherein the identification information is identification information on the test connector assembly, and
wherein the history information is history information related to a lifespan or usage frequency of the test connector assembly.

11. A test connector assembly disposed between a device to be inspected and test equipment to electrically connect the device to be inspected and the test equipment to each other, the test connector assembly comprising:

a frame supporting a connector for testing; and
an ID chip socket fixed to an upper side of the frame,
wherein the ID chip socket comprises:
  a contactor fixed to the upper side of the frame;
  a socket-conductive part penetrating the contactor in a vertical direction and configured to enable electrical connection in the vertical direction;
  an ID chip fixed to an upper side of the socket-conductive part and electrically connected to the socket-conductive part; and
  a cover configured to cover an upper surface of the ID chip and fixed to at least one of the contactor and the frame.

12. The test connector assembly of claim 11, wherein the cover is fixed to the frame.

13. The test connector assembly of claim 12, wherein the frame comprises a plurality of layers including at least one first layer and at least one second layer below the at least one first layer, which are stacked in the vertical direction, and
  wherein a portion of the first layer is opened such that the cover is fixed to an upper surface of the second layer.

14. The test connector assembly of claim 11, wherein the frame comprises a plurality of layers including at least one first layer and at least one second layer below the at least one first layer, which are stacked in the vertical direction, and
  wherein a portion of the first layer is opened such that the contactor is fixed to an upper surface of the second layer.

15. The test connector assembly of claim 11, wherein the frame comprises a plurality of layers further comprising at least one first layer and at least one second layer below the at least one first layer, which are stacked in the vertical direction,
  wherein a portion of the first layer is opened such that a portion of an upper surface of the second layer is exposed, and
  wherein each of the contactor and the cover is fixed to the portion of the upper surface of the second layer.

16. The test connector assembly of claim 15, wherein a hole is formed in a central portion of the portion of the upper surface of the second layer such that a lower end of the socket-conductive part is exposed downward.

17. The test connector assembly of claim 11, wherein the upper surface of the ID chip and an inner downwardly-facing surface of the cover are disposed to form a vertical gap between the upper surface of the ID chip and the inner downwardly-facing surface of the cover.

18. The test connector assembly of claim 11, wherein the cover is formed by coating the ID chip with a silicon material.

19. The test connector assembly of claim 11, wherein the contactor comprises a base plate made of an insulating material, and
  wherein the socket-conductive part further comprises:
  a penetration portion made of a conductive material and vertically penetrating the base plate;
  an upper conductive plate disposed between an upper end of the penetration portion and the ID chip to enable electrical connection, the upper conductive plate being fixed to an upper surface of the base plate; and
  a lower conductive plate disposed at a lower end of the penetration portion to enable electrical connection, the lower conductive plate being fixed to a lower surface of the base plate.

20. A test equipment set comprising:
a test equipment; and
a test connector assembly disposed between a device to be inspected and the test equipment to electrically connect the device to be inspected and the test equipment to each other,
wherein the test connector assembly further comprises:
  a frame supporting a connector for testing; and
  an ID chip socket fixed to an upper side of the frame,
wherein the ID chip socket comprises:
  a contactor fixed to the upper side of the frame;
  a socket-conductive part penetrating the contactor in a vertical direction and configured to enable electrical connection in the vertical direction, the socket-conductive part having a lower end brought into contact with the test equipment;
  an ID chip fixed to an upper side of the socket-conductive part and electrically connected to the socket-conductive part; and
  a cover configured to cover an upper surface of the ID chip and fixed to at least one of the contactor and the frame, and
wherein the ID chip is configured to execute at least one of an identification function of identifying at least one of the device to be inspected and the test connector assembly and a history management function of tracking a history of the ID chip socket, by receiving an electrical signal from the test equipment or sending an electrical signal to the test equipment.

\* \* \* \* \*